United States Patent [19]

Ohba et al.

[11] Patent Number: 5,148,060
[45] Date of Patent: Sep. 15, 1992

[54] ECL INPUT BUFFER FOR BICMOS

[75] Inventors: Atsushi Ohba; Shigeki Ohbayashi, both of Hyogo, Japan

[73] Assignee: Mitsubishi Denki Kabushiki Kaisha, Tokyo, Japan

[21] Appl. No.: 624,092

[22] Filed: Dec. 7, 1990

[30] Foreign Application Priority Data

Dec. 14, 1989 [JP] Japan ................................. 1-326284
Jun. 18, 1990 [JP] Japan ................................. 2-160214

[51] Int. Cl.[5] .................. H03K 19/092; H03K 19/086
[52] U.S. Cl. ..................................... 307/475; 307/454; 307/455; 307/446
[58] Field of Search ................. 307/475, 454, 455, 446

[56] References Cited

U.S. PATENT DOCUMENTS

| 4,605,864 | 8/1986 | Varadarajan et al. | 307/475 |
| 4,682,054 | 7/1987 | McLaughlin | 307/443 |
| 5,030,852 | 7/1991 | Higashisaka | 307/475 |
| 5,043,603 | 8/1991 | Ohba et al. | 307/475 |

FOREIGN PATENT DOCUMENTS 115620 7/1987 Japan .

Primary Examiner—Edward P. Westin
Assistant Examiner—Richard Roseen
Attorney, Agent, or Firm—Lowe, Price, LeBlanc & Becker

[57] ABSTRACT

An ECL buffer circuit includes an input portion for receiving an input signal at an ECL level, a current switch portion and an output portion. The input portion includes a bipolar transistor (Q1), a level-shift diode (D1) and a constant current source (CS1). The current switch portion includes a first and a second switch circuits and a constant current source (CS2). Each switch circuit includes a resistor (R1, R2) and a bipolar transistor (Q2, Q3). The output portion includes a first and a second output circuits and a constant current source (CS3). Each output circuit includes an emitter follower transistor (Q4, Q5) and a bipolar transistor (Q6, Q7). The first output circuit receives an input signal from the input portion, and the second output circuit receives a reference voltage ($V_{BB}$). A by-pass resistor (R3, R4) is connected between the base and the emitter of an emitter follower transistor (Q4, Q5) of each output circuit. When the output signal changes from a second level to a first level, the output signal thereby rapidly changes to a predetermined voltage by the emitter follower transistor (Q4, Q5) at first, then changes to a first level by way of the by-pass operation of the by-pass resistor (R3, R4).

18 Claims, 22 Drawing Sheets

20b: LEVEL CONVERTING CIRCUIT

20c : LEVEL CONVERTING CIRCUIT

ECL INPUT BUFFER FOR BICMOS

BACKGROUND OF THE INVENTION

1. Field of the Invention

The present invention relates generally to semiconductor integrated circuits, and, more particularly, an improvement in buffer circuits for receiving input signals.

2. Description of the Background Art

The BiCMOS technology has been so far developed in which an ECL (Emitter Coupled Logic) circuit capable of a high-speed operation and having a high load drive capability and a CMOS circuit of less power consumption are combined.

FIG. 17A is a circuit diagram showing a first conventional ECL buffer circuit for receiving a signal of an ECL level.

In FIG. 17A, an input portion comprises a bipolar transistor Q1, a level shifting diode D1 and a constant current source CS1. The base of the transistor Q1 receives an input signal Vin of an ECL level. The collector of the transistor Q1 is connected to a ground terminal receiving a ground voltage $V_{cc}$ while the emitter is connected to a node N1 through the diode D1. The constant current source CS1 is connected between the node N1 and a power supply terminal receiving a negative voltage $V_{EE}$.

A resistor R1 and a bipolar transistor Q2 form a first switch circuit, and a resistor R2 and a bipolar transistor Q3 form a second switch circuit. A current switch portion comprises a first and a second switch circuits and a constant current source CS2. The resistor R1 is connected between the ground terminal and a node N4. The collector of the transistor Q2 is connected to the node N4, the emitter is connected to the node N2, and the base is connected to the node N1. The resistor R2 is connected between the ground terminal and a node N5. The collector of the transistor Q3 is connected to the node N5, the emitter is connected to the node N2, and the base receives a reference voltage $V_{BB}$. The constant current source CS2 is connected between the node N2 and the power supply terminal.

The first output circuit comprises an emitter follower bipolar transistor Q4, and the second output circuit comprises an emitter follower bipolar transistor Q5. An output portion comprises a first and a second output circuits and constant current sources CS3, CS4. The collector of the transistor Q4 is connected to the ground terminal, the emitter is connected to the node N6, and the base is connected to the node N4. The constant current source CS3 is connected between the node N6 and the power supply terminal. The collector of the transistor Q5 is connected to the ground terminal, the emitter is connected to a node N7, and the base is connected to the node N5. The constant current source CS4 is connected between the node N7 and the power supply terminal. An output signal $\bar{a}$ (NOR output) is output from the node N6, and an output signal a (OR output) is output from the node N7.

The logically high level (hereinafter referred to as H level) of the input signal Vin of an ECL level is normally −0.9 V, and the logically low level (hereinafter referred to as L level) of that is normally −1.7 V. The reference voltage $V_{BB}$ is set so as to be an intermediate voltage between an H level and an L level of the base voltage of the transistor Q2.

The operation of the ECL buffer circuit of FIG. 17A will now be described with reference to a waveform diagram of FIG. 17B.

When the level of the input signal Vin changes from an L level to an H level, the level of the base voltage of the transistor Q2 also changes to an H level. Consequently, the transistor Q2 turns on, and the transistor Q3 turns off. As a result, the base voltage (the voltage of the node N4) of the transistor Q4 attains an L level indicated by $V_{cc} - R_1 \cdot I2$, where $R_1$ is the value of the resistance of R1, and I2 is a current flowing through the constant current source CS2. Also, the base voltage (the voltage of the node N5) of the transistor Q5 almost attains an H level indicated by $V_{CC}$.

Accordingly, the output signal $\bar{a}$ from the node N6 attains an L level indicated by of $V_{CC} - V_{BE} - R_1 \cdot I2$. The output signal a from the node N7 attains an H level indicated by of $V_{CC} - V_{BE}$.

Conversely, when the level of the input signal Vin changes from an H level to an L level, the output signal $\bar{a}$ attains an H level indicated by $V_{CC} - V_{BE}$, and the output signal a attains an L level indicated by $V_{CC} - V_{BE} - R_2 \cdot I2$, where $R_2$ is the resistance value of the resistor R2.

FIG. 18A is a circuit diagram of a second conventional ECL buffer circuit.

In the ECL buffer circuit of FIG. 18A, the constant current source CS4, which is included in the output portion of the ECL buffer circuit of FIG. 17A, is eliminated for lower power consumption. The output portion is further provided with bipolar transistors Q6, Q7. The collector of the transistor Q6 is connected to the node N6, and the base is connected to the node N1. The collector of the transistor Q7 is connected to the node N7, and the base receives the reference voltage $V_{BB}$. The emitters of the transistors Q6, Q7 are each connected to the constant current source CS3 through the node N3.

The operation of the ECL buffer circuit of FIG. 18A will now be described with reference to a waveform diagram of FIG. 18B.

When the level of the input signal Vin changes from an L level to an H level, the levels of the base voltages of the transistors Q2, Q6 changes to an H level. Thus, the transistors Q2, Q6 turn on, and the transistors Q3, Q7 turn off. As a result, the voltage of the node N4 attains an L level indicated by $V_{CC} - R_1 \cdot I2$, and the voltage of the node N5 attains an H level indicated by $V_{CC}$.

Therefore, the output signal $\bar{a}$ attains an L level indicated by $V_{CC} - V_{BE} - R_1 \cdot I2$, and the output signal a attains an H level indicated by $V_{CC} - V_f$, where, $V_f$ indicates the base-emitter voltage of the NPN transistor when there is little electric current in the NPN transistor, which attains a value smaller than that of the base-emitter voltage $V_{BE}$ of the NPN transistor in a normal on-state ($V_f < V_{BE}$).

When the level of the input signal Vin changes from an H level to an L level, the output signal $\bar{a}$ attains an H level indicated by $V_{CC} - V_f$, and the output signal a attains an L level indicated by $V_{CC} - V_{BE} - R_2 \cdot I2$.

FIG. 19A is a circuit diagram of a third conventional ECL buffer circuit.

In the ECL buffer circuit of FIG. 19A, there no emitter follower bipolar transistors Q4, Q5 and no constant current sources CS3, CS4 of the ECL buffer circuit shown in FIG. 17A, the output signal $\bar{a}$ is output from the node N4, and the output signal a is output from the node N5.

The operation of the ECL buffer circuit of FIG. 19A will now be described with reference to a waveform diagram of FIG. 19B.

In the ECL buffer circuit of FIG. 19A, the emitter follower transistors Q4, Q5 of FIG. 17A are removed, and output signals $\bar{a}$, a are output respectively from the nodes N4, N5, so that, as described in FIG. 17A, the H level of the output signals $\bar{a}$, a from the nodes N4, N5 is equal to the ground voltage $V_{CC}$, and the L level of that is equal to $V_{CC}-RL1\cdot I2$, where RL1 indicates R or $R_2$.

FIG. 20A is a circuit diagram of a fourth conventional ECL buffer circuit.

In the ECL buffer circuit of FIG. 20A, resistors R25, R26, R27 are connected in place of the resistors R1, R2 in the ECL buffer circuit of FIG. 19A. One terminals of the resistors R26, R27 are connected to the nodes N4, N5, respectively, and the other terminals are connected to the ground terminal through the resistor R25. In the ECL buffer circuit of FIG. 20A, as shown in the waveform diagram of FIG. 20B, the value of the H level of the output signals a, $\bar{a}$ becomes low. This value of the H level can be set to any value by changing the resistance values of the resistors R25 to R27.

The ECL buffer circuit of FIG. 17A is disclosed, for example, in "the development of 6 ns/800 mW 64 K×1 BiCMOS ECL RAM", Technical Research Report of the Institute of the Electronics, Information and Communication Engineers of Japan Vol, 89, No. 140, pp. 13–18. The ECL buffer circuit of FIG. 18A is disclosed, for example, in the above Technical Research Report of the Institute the Electronics, Information and Communication Engineers of Japan and in Japanese Patent Laying-Open No. 59-115620. In addition, the ECL buffer circuit of FIG. 19A is disclosed, for example, by I. Fukushi, et al in "A 256Kb ECL RAM with Redundancy", 1988 ISSCC, pp. 134–135 (Feb. 1988) and in Japanese Patent Laying-Open No. 62-123825.

FIG. 21 shows an example where the ECL buffer circuit of FIG. 17A is connected to the BiCMOS driver circuit over a level converting circuit.

In FIG. 21, the output signals a, $\bar{a}$ of the ECL buffer circuit 10 of FIG. 17A are supplied to a level converting circuit 20a comprising two current mirror circuits, and the output signals b, $\bar{b}$ of the level converting circuit 20a are connected to a BiCMOS driver circuit 30 comprising a composite circuit of a bipolar transistor and a CMOS.

The level converting circuit 20a comprises a first current mirror circuit having PMOS transistors MP1, MP2 and NMOS transistors MN1, MN2, and a second current mirror circuit having PMOS transistors MP3, MP4 and NMOS transistors MN3, MN4. The gates of the transistors MP1, MP4 are provided with the output signal a, and the gates of the transistors MP2, MP3 are provided with the output signal $\bar{a}$. An output signal b of an MOS level is output from the node of the transistor MP2 and the transistor MN2, and an output signal $\bar{b}$ of an MOS level is output from the node of the transistor MP4 and the transistor MN4.

The BiCMOS driver circuit 30 comprises a first CMOS inverter having a PMOS transistor MP5 and an NMOS transistor MN5, a second CMOS inverter having a PMOS transistor MP6 and an NMOS transistor MN8, a first base control circuit having NMOS transistors MN6 and MN7, a second base control circuit having NMOS transistors MN9 and MN10, and NPN transistors QD1 to QD4. The transistors QD1, QD2 and the transistors QD3, QD4 are totem-pole-connected respectively between a ground terminal receiving the ground voltage $V_{CC}$ and the power supply terminal receiving a negative voltage $V_{EE}$.

When the level of the input signal Vin of an ECL level changes from an L level to an H level, as described in FIG. 17A, the level of the output signal a of the ECL buffer circuit 10 changes from an L level to an H level, and the level of the output signal $\bar{a}$ changes from an H level to an L level.

Therefore, the transistors MP1, MP4 of the level converting circuit 20a turn off, and the transistors MP2, MP3 turn on. The current from the ground terminal is thereby cut off by the transistor MP1 so that the voltage of the drain and the gate of the transistor MN1 is lowered to $V_{EE}+Vtn$, causing the transistor MN1 to turn off where Vtn is a threshold voltage of the NMOS transistor. The gate of the transistor MN2 is connected to the gate and the drain of the transistor MN1 so that the transistor MN2 turns off. Since the voltages of the gate and the drain of the transistor MN3 increase, the transistor MN3 turns on. Since the gate of the transistor MN4 is connected to the gate and the drain of the transistor MN3, the transistor MN4 also turns on.

The transistor MP2 is on and the transistor MN2 is off, so that the level of the output signal b of the level converting circuit 20a changes from an L level (negative voltage $V_{EE}$) to an H level (ground voltage $V_{CC}$). The transistor MP4 is off and the transistor MN4 is on, so that the level of the output signal $\bar{b}$ changes from an H level (ground voltage $V_{CC}$) to an L level (negative voltage $V_{EE}$). The levels of these output signals b, $\bar{b}$ are adapted for an MOS level. The conversion from an ECL level to an MOS level is, therefore, carried out.

As the level converting circuit 20a comprises a MOS transistor, its load drive capability is not so high, and thus, it is necessary to increase the drive capability by way of the BiCMOS driver circuit 30 in the next stage.

As described above, when the level of the output signal b changes to an H level, the transistor MP5 turns off, and the transistors MN5, MN6 turn on. The transistor MN7 turns off. Therefore, the transistor QD1 turns off, and the transistor QD2 turns on. Consequently, a signal $\bar{c}$ output from the BiCMOS driver circuit 30 attains an L level, $(V_{EE}+V_f)$.

When the level of the output signal $\bar{b}$ changes to an L level as stated above, the transistor MP6 turns on, and the transistors MN8, MN9 turn off. The transistor MN10 turns on. Accordingly, the transistor QD3 turns on, and the transistor QD4 turns off. As a result, a signal c output from the BiCMOS driver circuit 30 attains an H level $(V_{CC}-V_f)$. The level of these signals c, $\bar{c}$ is referred to as a BiCMOS level.

As above mentioned, a conversion of the logic level is carried out between an ECL circuit and a MOS circuit.

The level converting circuit 20b shown in FIG. 22 or the level converting circuit 20c shown in FIG. 23 may be used in place of the level converting circuit 20a shown in FIG. 21.

In FIG. 22, the output signal a of the ECL buffer circuit is supplied to the gates of the PMOS transistors MP7, MP10, and the output signal $\bar{a}$ is supplied to the gates of the PMOS transistors MP8, MP9. The sources of the transistors MP7, MP9 are connected to the ground terminal, and the drains of the transistors MP8, MP10 are connected to the power supply terminal. While the drain of the transistor MP7 and the source of the transistor MP8 are connected to the drain of the NMOS transistor MN11 and the base of the bipolar transistor QCI, the drain of the transistor MP9 and the source of the transistor MP10 are connected to the drain of the NMOS transistor MN14 and the base of the bipolar transistor QC2.

The collectors of the transistors QC1, QC2 are connected to the ground terminal, and the sources of the NMOS transistors MN11, MN12, MN13, MN14 are connected to the power supply terminal. The emitter of the transistor QC1 is connected to the drain of the transistor MN12 and the gates of the transistors MN13, MN14, and the emitter of the transistor QC2 is connected to the drain of the transistor MN13 and the gates of the transistors MN11, MN12. The output signal b of the level converting circuit 20b is output from the emitter of the transistor QC2, and the output signal $\overline{b}$ is output from the emitter of the transistor QC1.

The operation of the level converting circuit 20b of FIG. 22 will now be described.

When the level of the output signal a of the ECL buffer circuit changes from an L level to an H level, and the level of the output signal $\overline{a}$ changes from an H level to an L level, then the transistors MP7, MP10 turn off, and the transistors MP8, MP9 turn on. Accordingly, the potential of the drain of the transistor MP7 rises, and the potential of the drain of the transistor MP9 falls.

Thus, the transistor QCI starts turning off, and the transistor QC2 starts turning on. Then, the emitter of the transistor QC2 is charged rapidly and the gate voltages of the transistors MN11, MN12 rise, causing their transistors to turn on, whereby the transistor QC1 and the transistors MN13, MN14 turn off.

Since the transistor QC2 is on, and the transistor MN13 is off, the level of the output signal b changes from an L level (negative voltage $V_{EE}$) to an H level (ground voltage $V_{CC}-V_f$). Since the transistor QC1 is off and the transistor MN12 is on, the level of the output signal $\overline{b}$ changes from an H level (ground voltage $V_{CC}-V_f$) to an L level (negative voltage $V_{EE}$).

Conversely, when the level of the output signal a of the ECL buffer circuit changes from an H level to an L level, and the level of the output signal $\overline{a}$ changes from an L level to an H level, then the level of the output signal b changes from an H level to an L level, and the level of the output signal $\overline{b}$ changes from an L level to an H level, which is the reverse operation to the aforementioned.

In FIG. 23, the output signal a of the ECL buffer circuit is supplied to the gates of the PMOS transistor MP11 and the NMOS transistor MN15, and the output signal $\overline{a}$ is supplied to the gates of the PMOS transistor MP12 and the NMOS transistor MN17. The sources of the transistors MP11, MP12 are connected to the ground terminal. The sources of the NMOS transistors MN16, MN18 are connected to the power supply terminal. The gate of the transistor MN16 is connected to the drain of the transistor MP12, and the gate of the transistor MN18 is connected to the drain of the transistor MP11. The source of the transistor MN15 is connected to the drain of the transistor MN16, and the drain of the transistor MN15 is connected to the drain of the transistor MP11. The source of the transistor MN17 is connected to the drain of the transistor MN18, and the drain of the transistor MN17 is connected to the drain of the transistor MP12. The output signal b of the level converting circuit 20c is output from the drain of the transistor MP12, and the output signal $\overline{b}$ is output from the drain of the transistor MP11.

The operation of the level converting circuit 20c of FIG. 23 will now be described.

When the level of the output signal a of the ECL buffer circuit changes from an L level to an H level and the level of the output signal $\overline{a}$ changes from an H level to an L level, then the transistor MP11 turns off, and the transistor MP12 turns on. In addition, the on-resistance of MN15 is lowered, and the on-resistance of the transistor MN17 is increased. Therefore, the current of the transistor MP12 causes the potential of the drain to rise. At this time, it is possible to decrease the percentage of the feed-through current of the current flowing in the transistor MP12 since the on-resistance of the transistor MN17 is high.

The rise of the drain potential of the transistor MP12 causes the transistor MN16 to turn on, and the potential of the drain of the transistor MP11 to be decreased through the transistor MN15 of low on-resistance. Thus, the transistor MN18 turns off, and there is little feed-through current in the transistors MP12, MN17. Accordingly, the level of the output signal $\overline{b}$ changes from an L level (negative voltage $V_{EE}$) to an H level (ground voltage $V_{CC}$), and the level of the output signal b changes from an H level to an L level.

Conversely, when the level of the output signal a changes from an H level to an L level, and the level of the output signal $\overline{a}$ changes from an L level to an H level, then the level of the output signal b changes from an H level to an L level, and the level of the output signal $\overline{b}$ changes from an L level to an H level.

The level converting circuit 20a in FIG. 21 is disclosed, for example, in Japanese Patent Laying-Open No. 60-132416 and in Japanese Patent Laying-Open No. 62123825. The level converting circuit 20b in FIG. 22 is also disclosed for example in the above-mentioned literature 1988 ISSCC, pp. 134-135. In addition, the level converting circuit 20c in FIG. 23 is disclosed for example in the above Technical Research Report of the Institute of the Electronics, Information and Communication Engineers of Japan, Vol. 89, No. 140, pp. 13-18 and in the prior filed Japanese Patent Application No. 1-127113.

As described above, the H level of the output signals a, $\overline{a}$ of the ECL buffer circuit in FIG. 17A become $V_{CC}-V_{BE}$. In the level converting circuit 20a in FIG. 21, when the PMOS transistor, which is provided with an output signal of an H level from the ECL buffer circuit, completely turns off, it becomes possible to full-swing the output signals b, $\overline{b}$ from the ground voltage $V_{CC}$ to the negative voltage $V_{EE}$ with small feed-through current.

However, as shown in FIG. 17B, the H level of the output signals a, $\overline{a}$ reaches no more than $-0.8$ V since the base-emitter voltage $V_{BE}$ of the NPN transistor is normally set to 0.8 V. The threshold voltage Vtp of the PMOS transistor of the level converting circuit 20a is normally set to about $-0.7$ V. It therefore leads to $V_{CC}-V_{BE}<Vtp$, so that the gate-source voltage of the PMOS transistor, which is provided with the output signal of an H level, exceeds its threshold voltage. As a result, the PMOS transistor, which is essentially to turn off completely, turns on lightly so that a relatively large amount of feed-through current flows.

For example, in FIG. 21, when the output signal a of the ECL buffer circuit 10 is at an H level and the output signal $\overline{a}$ is at an L level, then the transistors MP1, MP4 lightly turn on without turning off, and the transistors MP2, MP3 turn on. Accordingly, a large amount of feed-through current flows in the path from the transistor MP1 to the transistor MN1, the path from the transistor MP2 to the transistor MN2 and the path from the transistor MP4 to MN4, where, originally, no large amount of feed-through current should flow.

In this case, the output level of the output signal b depends on the resistance division of the on-resistance of the transistor MP2 and the transistor MN2. The output level of the output signal $\bar{b}$ depends on the resistance division of the on-resistance of the transistor MP4 and the transistor MN4. Thus, the output level of the output signals b, $\bar{b}$ reaches an intermediate potential between the ground voltage $V_{CC}$ and the negative voltage $V_{EE}$. Thus, the output amplitude becomes narrower, without causing the output signals b, $\bar{b}$ to swing from the ground voltage $V_{CC}$ to the negative voltage $V_{EE}$. There is a problem that the output signal rises slowly since direct current also flows in the output stage which provides a signal of an H level.

In addition, if the output level of the output signals b, $\bar{b}$ becomes an intermediate potential, it causes a large amount of feed-through current to flow also in the BiCMOS driver circuit 30 which receives the output signal b, $\bar{b}$.

Thus, the ECL buffer circuit in FIG. 17A entails a problem of large power consumption and a slow rise speed of the output signal.

A problem similar to the above-mentioned also exists in the case in which the ECL buffer circuit of FIG. 17A is connected to either the level converting circuit 20b in FIG. 22 or the level converting circuit 20c in FIG. 23. The problem above becomes more serious particularly in the level converting circuit 20b of FIG. 22 having an output stage of the bipolar transistor. The reason is because the bipolar transistor amplifies the current flowing in the PMOS transistor, which should naturally turn off.

Since there is no current through the emitter follower transistor which provides a signal of an H level in the ECL buffer circuit of FIG. 18A, as shown in FIG. 18B, the output signal a rises rapidly to about −0.7 V, and then is charged very slowly to about the ground voltage (0 V).

Thus, when the time intervals between the first switching of the input signal and the next switching of the input signal differ in a plurality of ECL buffer circuits, the potentials of an H level differ in each ECL buffer circuit. For example, assuming that in one of the two ECL buffer circuits the input signal switches immediately before, and the input signal does not switch for a sufficiently long period of time in the other. In this case, if the input signals supplied to the two ECL buffer circuits switch at the same time, then it results in a skew at a switching timing of the output signals of those ECL buffer circuits. If the ECL buffer circuit is applied to a memory circuit, then such a skew leads to a state in which another memory cell is erroneously selected transitionally at a switching time of the address. Therefore, there is a problem that the access speed must be made slow.

In the ECL buffer circuit of FIG. 19A, the H level of the output signals a, $\bar{a}$ is equal to the ground voltage $V_{CC}$ as shown in FIG. 19B, so that the PMOS transistor, which is provided with its output signal, completely turns on.

The load capacity, however, which is provided with the output signals a, $\bar{a}$ is charged through the resistors R1, R2 so that the waveforms of the output signals a, $\bar{a}$ slowly change. Therefore, the switching speed of the level converting circuit in the next stage becomes slow. The larger the amplitude of the output of the ECL buffer circuit is made, the more significant the delay of the switching speed becomes.

As the ECL buffer circuit of FIG. 19A has no emitter follower transistor, it is encountered with a problem of a low load drive capability.

The ECL buffer circuit of FIG. 20A, as well as the ECL buffer circuit of FIG. 19A, has a problem that it has a slow switching speed and low load drive capability.

In consideration of the conventional ECL buffer circuit mentioned above, the characteristics desired for an ECL buffer circuit connected to a level converting circuit are as follows:

(1) The H level of the output signal becomes higher than the threshold voltage of the PMOS transistor driven thereby;

(2) The output signal switches rapidly;

(3) The load drive capability is high;

(4) The output potential is constant when a certain period of time has passed which is shorter than the cycle time.

SUMMARY OF THE INVENTION

It is an object of the invention to provide a buffer circuit which satisfies some or all of the characteristics (1) to (4) shown above.

A semiconductor integrated circuit according to the invention comprises a plurality of buffer circuit, a first constant current source and a second constant current source.

Each buffer circuit comprises an input node receiving an input signal, an output node from which an output signal is derived, a first transistor, a first resistor, a second transistor and a third transistor. The first transistor is coupled between the voltage source and the output node, having a control terminal. The first resistor is connected between the voltage source and the control terminal of the first transistor. The second transistor is connected between the control terminal of the first transistor and the first constant current source, having a control terminal connected to the input node. The third transistor is connected between the output node and the second constant current source, having a control terminal which receives a signal in phase with the input signal.

In a semiconductor integrated circuit in accordance with first aspect of the invention, each buffer circuit further comprises a second resistor. The second resistor is connected between an output node and the control terminal of the first transistor.

In a semiconductor integrated circuit in accordance with a second aspect of the invention, each buffer circuit further comprises a second resistor. The second resistor is connected between an output node and a predetermined division point of the first resistor of other buffer circuit.

In a semiconductor integrated circuit in accordance with a third aspect of the invention, each buffer circuit further comprises a field-effect element. The field-effect element is connected between an output node and the control terminal of the first transistor, having a control terminal connected to an output node of other buffer circuit.

In a semiconductor integrated circuit in accordance with a fourth aspect of the invention, each buffer circuit further comprises a field-effect element. The field-effect element is connected between an output node and a predetermined division point of the first resistor of other buffer circuit, having a control terminal connected to an output node of other buffer circuit.

A semiconductor integrated circuit in accordance with a fifth aspect of the invention further comprises a second resistor. The second resistor is connected between the output node of the first buffer circuit and the output node of the second buffer circuit.

In a semiconductor integrated circuit in accordance with a sixth aspect of the invention, each buffer circuit further comprises a field-effect element. The field-effect element is coupled between the output node and a predetermined voltage, having a control terminal connected to an output node of other buffer circuit.

In each buffer circuit, when the second and the third transistors turn on in response to an input signal, the level of the output signal changes to a first level so as to be close to the voltage of the voltage source. When the second and the third transistors turn off in response to an input signal, the level of the output signal changes to a second level opposite to the first level.

In the semiconductor integrated circuits in accordance with the first and the second aspects, when the level of the output signal changes from the second level to the first level, the level of the output signal first is changed rapidly to a predetermined voltage by the first transistor, then changed to a first level by way of the by-pass operation of the second resistor.

In the semiconductor integrated circuits according to the third and the fourth aspects when the level of the output signal changes to the first level, the field-effect element attains a low impedance while the field-effect element attains a high impedance when the level of the output signal changes to the second level. Accordingly, in the case where the level of the output signal changes to the first level, the speed of the change of the waveform can be improved by way of the by-pass operation of the field-effect element. When the level of the output signal changes to the second level, the amount of current which flows through the field-effect element becomes small. Thus, the load with respect to the first resistor becomes small and the switching speed becomes faster.

In a semiconductor integrated circuit in accordance with the fifth aspect, when the level of the output signal changes to a first level, the second resistor conducts a by-pass operation, so that a small amount of current flows through the first transistor. The level of the output signal thereby becomes constant when a certain period of time has passed.

In a semiconductor integrated circuit in accordance with the sixth aspect, when the level of the output signal of one buffer circuit changes to a first level, the level of the output signals of other buffer circuits changes to a second level. The field-effect element of one buffer circuit attains a low impedance state, so that the level of the output signal becomes equal to a predetermined voltage. In this case, the field-effect element of other buffer circuits (attains) a high impedance state.

As stated above, in accordance with the present invention, the first level of the output signal becomes higher than the threshold value of the transistor which receives it. Accordingly, the power consumption is reduced. In addition, the switching speed becomes high, the load drive capability is large and the output voltage remains constant when a certain period of time has passed. The range of the operational voltage may be expanded, so that a low voltage operation is made possible.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will now be described in more detail with reference to the following drawings.

Figure 1A:
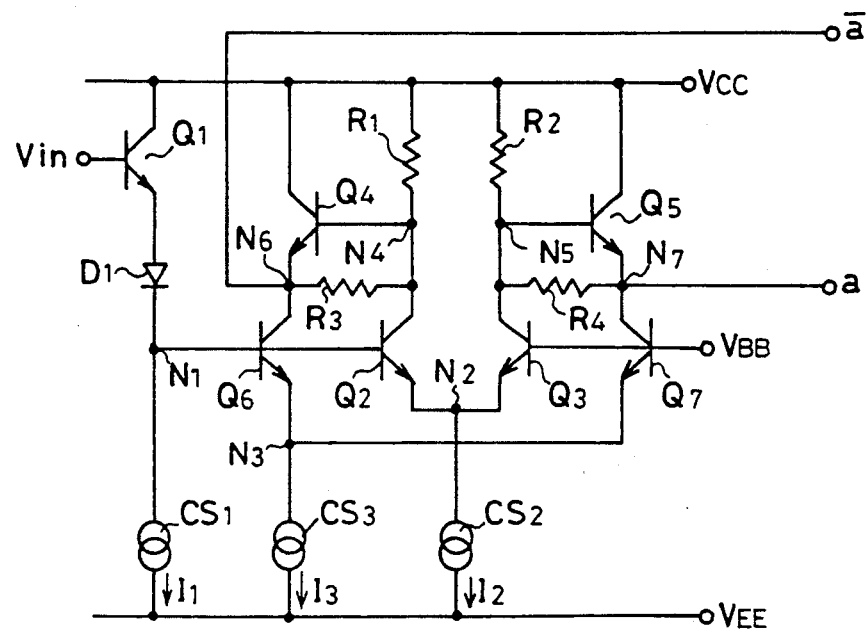
FIG. 1A is a circuit diagram of an ECL buffer circuit in accordance with a first embodiment of the present invention.

FIG. 1A is a circuit diagram of an ECL buffer circuit in accordance with a first embodiment of the present invention.

In FIG. 1A, an input portion comprises a transistor Q1, a diode D1 for level-shift and a constant current source CS1. A first switch circuit comprises a resistor R1 and a transistor Q2, and a second switch circuit comprises a resistor R2, and a transistor Q3. A current switch comprises a first switch circuit, a second switch circuit and a constant current source CS2. A first output circuit comprises transistors Q4, Q6, and a second output circuit comprises transistors Q5, Q7. An output portion comprises a first output circuit, a second output circuit and a constant current source CS3.

The first switch circuit and the first output circuit correspond to a first buffer circuit means, the second switch circuit and the second output circuit correspond to a second buffer circuit means, and the constant current sources CS2, CS3 correspond to the first and the second constant current source respectively.

In the ECL buffer circuit of FIG. 1A, resisters R3 and R4 are further connected between a node N4 and a node N6 and between a node N5 and a node N7 respectively. The circuit configuration of other portion is same as that of the second conventional ECL buffer circuit shown in FIG. 18A.

The transistor Q6 becomes saturated when the base-collector voltage is normally 0.2 V or less. Therefore, the diode D1 for level-shift is provided so as to prevent the saturation of the transistor Q6.

The operation of the ECL buffer circuit of FIG. 1A will now be described with reference to the waveform diagram of FIG. 1B.

When the level of the input signal Vin of ECL level changes from an L level ($-1.7$ V) to an H level ($-0.9$ V), the base voltages of the transistors Q2, Q6 (the voltage of the node N1) also change from an L level to an H level. The transistors Q2, Q6 thereby turn on, and the transistors Q3, Q7 turn off. As a result, the base voltage of the transistor Q4 (the voltage of the node N4) attains an L level represented by $V_{CC} - R_1 \cdot (I2 + V_{BE}/R_3)$, where $R_1$ and $R_3$ are the resistance values of the resistor R1 and the resistor R3 respectively, I2 is a current flowing through the constant current source CS2, and $V_{BE}$ is the base-emitter voltage of the NPN transistor. Accordingly, the output signal $\bar{a}$ from the node N6 (an NOR output) attains an L level represented by $V_{CC} - R_1 \cdot I2 - (1 + R_1/R_3) \cdot V_{BE}$.

No current flows through the resistors R2, R4, so that the base voltage of the transistor Q5 (the voltage of the node N5) and the emitter voltage (the voltage of the node N7) almost attain an H level represented by $V_{CC}$. The output signal a from the node N7 (an OR output) therefore attains an H level represented by $V_{CC}$.

Figure 1B:
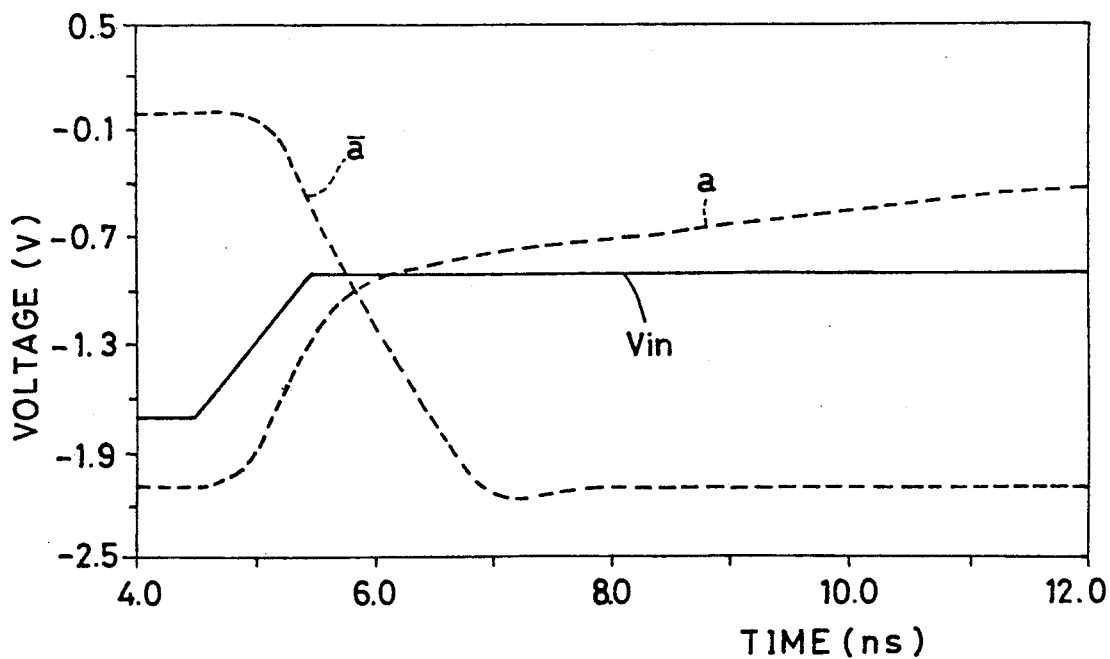
FIG. 1B is a waveform diagram of an input and an output signals of the first embodiment.

As shown in FIG. 1B, the output signal a rapidly rises from the potential of an L level to $-0.8$ V by way of the emitter follower transistor Q5, and then slowly rises by way of the by-passing resistor R4. The rise time by by-passing resistor R4 may be determined by the resistance value of the resistor R4.

When the level of the input signal Vin changes from an H level ($-0.9$ V) to an L level ($-1.7$ V), the voltage of the node N1 changes from an H level to an L level. Thus, the transistors Q2, Q6 turn off, and the transistors Q3, Q7 turn off.

There is no current through the resistors R1, R3, so that the voltage of the node N4 and the voltage of the node N6 almost attain an H level represented by $V_{CC}$. Accordingly, the output signal $\bar{a}$ from the node N6 attains an H level represented by $V_{CC}$.

The voltage of the node N5 becomes an L level represented by $V_{CC} - R_2 \cdot (I2 + V_{BE}/R_4)$, where $R_2$ and $R_4$ are the resistance values of the resistors R2 and R4 respectively. The output signal a from the node N7 therefore attains an L level represented by $V_{CC} - R_2 \cdot I2 - (1 + R_2/R_4) \cdot V_{BE}$.

Figure 2A:
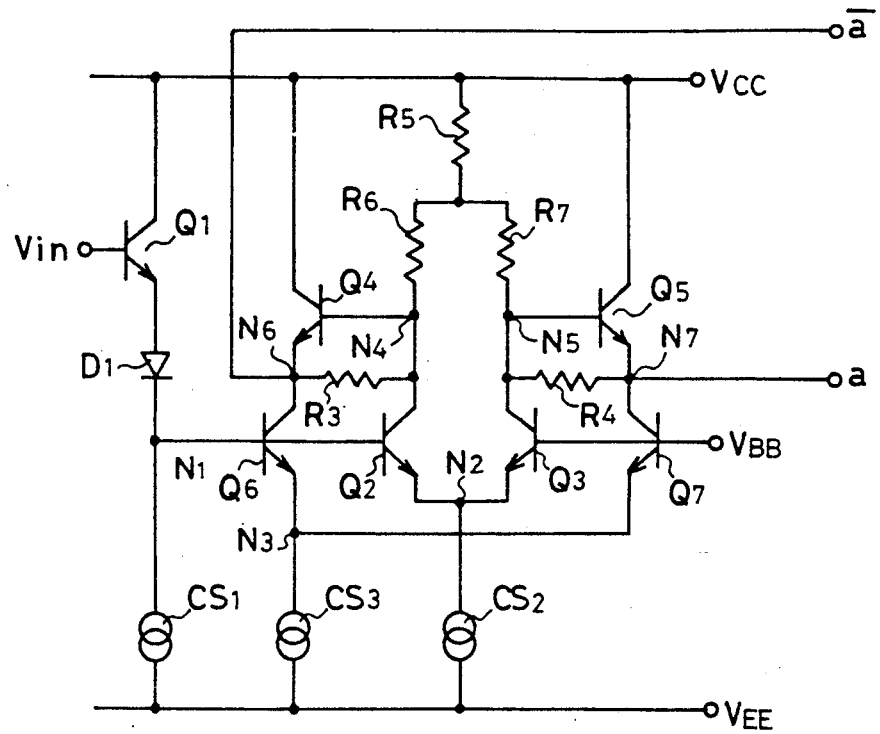
FIG. 2A is a circuit diagram of an ECL buffer circuit in accordance with a second embodiment of the present invention.
Figure 2B:
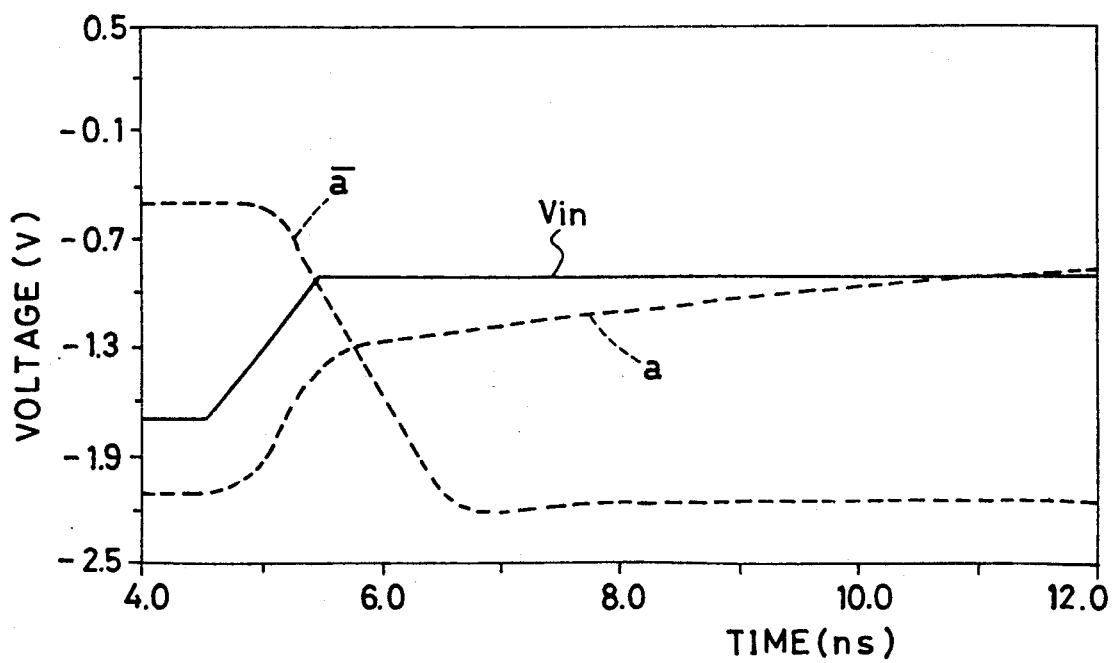
FIG. 2B is a waveform diagram of an input and an output signals of the second embodiment.

FIG. 2A is a circuit diagram of an ECL buffer circuit in accordance with a second embodiment of the present invention, and FIG. 2B is a waveform diagram of an input signal and an output signal in the ECL buffer circuit.

The ECL buffer circuit of FIG. 2A is different from the ECL buffer circuit of FIG. 1A in that resistors R5, R6, R7 are provided in place of the resistors R1, R2.

One terminal of the resistor R5 is connected to the ground terminal. The resistor R6 is connected between the other terminal of the resistor R5 and the node N4, and the resistor R7 is connected between the other terminal of the resistor R5 and the node N5.

In the ECL buffer circuit of FIG. 2A, as shown in the waveform diagram of FIG. 2B, the potential of the output signal of an H level is lower than that of the ECL buffer circuit of FIG. 1A. The final potential is set to −0.6 V in the ECL buffer circuit of FIG. 2A since the final potential of the output signal of an H level needs only to be higher than the threshold voltage of the PMOS transistor driven thereby. This potential may be determined by the resistance values of the resistors R5 to R7.

In the embodiment of FIG. 2A, as the amplitudes of the output signals a, ā are small, high speed switching can be achieved. However, not so short a time is required until the output signal is charged to a potential higher than the threshold of the PMOS transistor since the region charged by the emitter follower transistors Q4, Q5 becomes smaller.

Figure 3A:
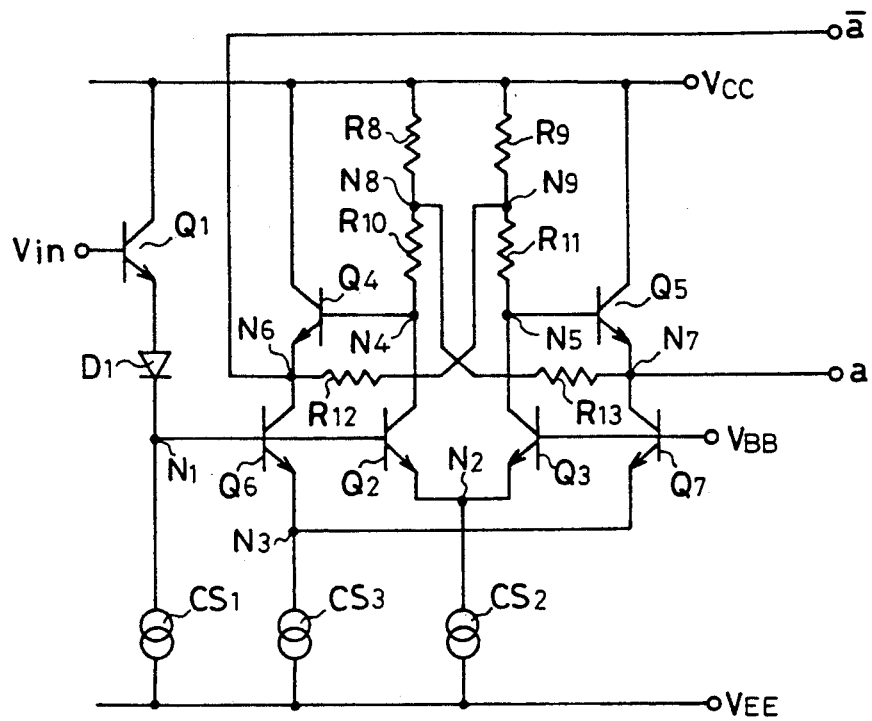
FIG. 3A is a circuit diagram of an ECL buffer circuit in accordance with a third embodiment of the present invention.
Figure 3B:
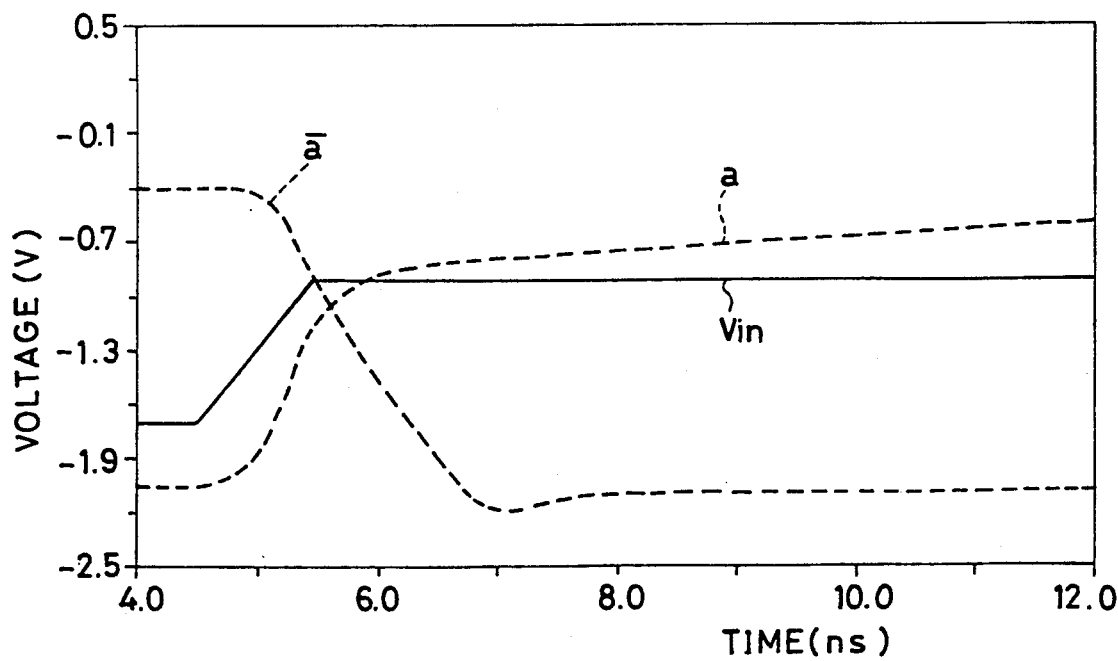
FIG. 3B is a waveform diagram of an input and an output signals of the third embodiment.

FIG. 3A is a circuit diagram of an ECL buffer circuit in accordance with a third embodiment of the present invention, and FIG. 3B is a waveform diagram of an input signal and an output signal in the ECL buffer circuit.

The ECL buffer circuit of FIG. 3A is different from the ECL buffer circuit of FIG. 1A in that resistors R8 to R13 are provided in place of the resistors R1 to R4. Between the ground terminal and the node 4, the resistor R8 and the resistor R10 are connected in series through the node N8 therebetween. Between the ground terminal and the node N5, the resistors R9 and R11 are connected through the node N9 therebetween. The resistor R12 is connected between the node N6 and the node N9, and the resistor R13 is connected between the node N7 and the node N8.

In the embodiment of FIG. 3A, the rise time of the output signal to an H level may be improved relative to that of the embodiment of FIG. 2A.

As shown in FIG. 3B, the output signal a rapidly rises from the potential of an L level to −0.8 V by way of the emitter follower transistor Q5. In addition, a final potential of the output signal of an H level may be set to any value by changing the resistance values of the resistors R8 to R13.

Therefore, in accordance with the embodiment of FIG. 3A, the H level of the output signal is higher than the threshold voltage of the PMOS transistor, and the switching speed is increased.

Figure 4A:
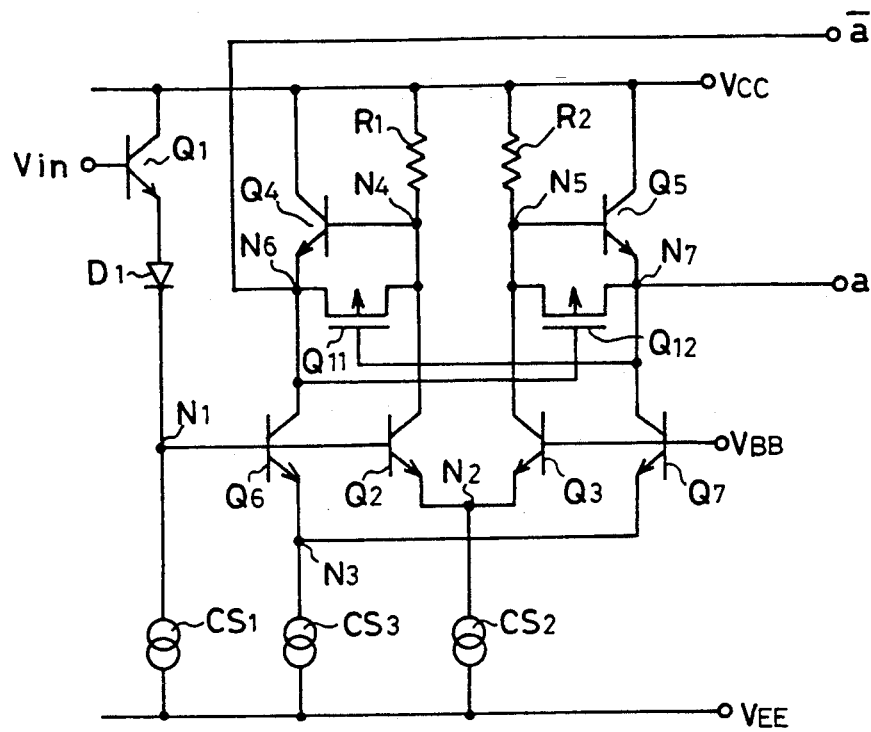
FIG. 4A is a circuit diagram of an ECL buffer circuit in accordance with a fourth embodiment of the present invention.
Figure 4B:
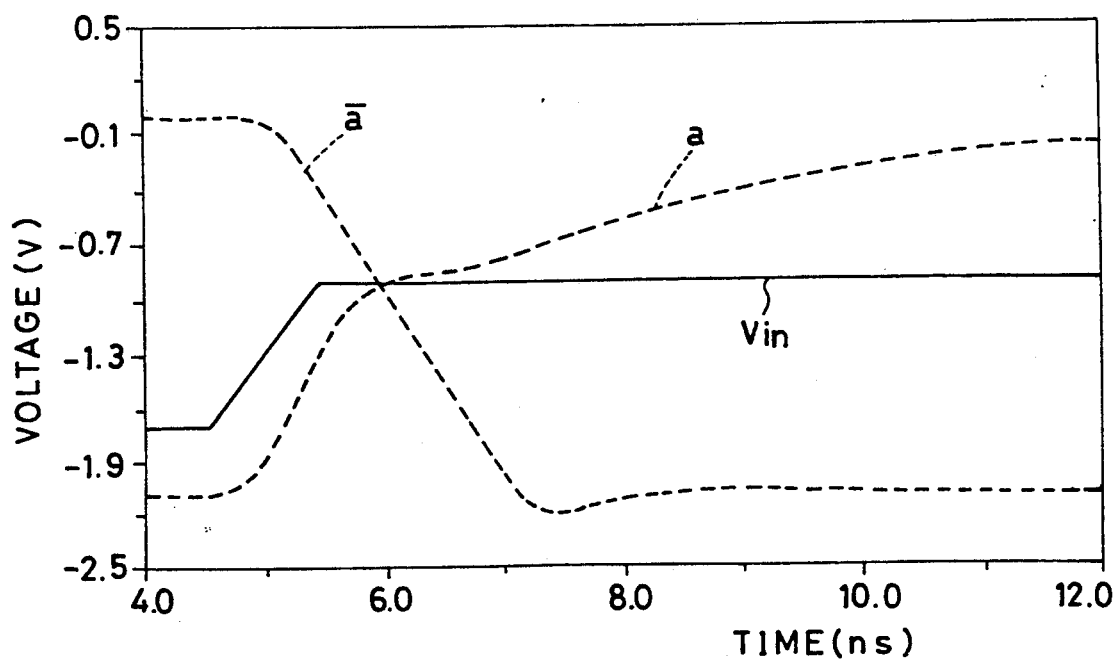
FIG. 4B is a waveform diagram of an input and and an output signals of the fourth embodiment.

FIG. 4A is a circuit diagram of an ECL buffer circuit in accordance with a fourth embodiment of the present invention, and FIG. 4B is a waveform diagram of an input signal and an output signal in the ECL buffer circuit.

The ECL buffer circuit of FIG. 4A is different from the ECL buffer circuit in FIG. 1A in that PMOS transistors Q11, Q12 are provided in place of the resistors R3, R4. The transistor Q11 is connected between the node N4 and the node N6 with the gate connected to the node N7. The transistor Q12 is connected between the node N5 and the node N7 with the gate connected to the node N6.

In the embodiment of FIG. 4A, as shown in the waveform diagram of FIG. 4B, the rise of the output signal after the emitter follower transistor Q4 or Q5 turns off, becomes faster without delaying the fall of the output signal. The reason for that will be explained in the following.

In the embodiment of FIG. 1A, consider the case in which the resistance values of by-passing resistors R3, R4 are set to a small value in order to make the rise of the output signal faster after the emitter follower transistor Q4 or Q5 turns off. In this case, for example, when the level of the output signal a switches from an L level to an H level, a current flows through the by-passing resistor R4 so that the base-emitter voltage of the emitter follower transistor Q5 is 0.8 V. The base-emitter voltage of 0.8 V is a voltage is required to maintain the transistor Q5 in an on state. If the resistance value of the resistor R4 is small, the amount of the current flowing through the resistor R4 becomes large, thereby describing the apparent current amplification degree of the bipolar transistor. As a result, there is a problem that the apparent load capacity with respect to the load resistor R2 becomes large so that the switching speed of the ECL buffer circuit itself becomes slow.

In the embodiment of FIG. 4A, each of the PMOS transistors Q11, Q12 attains a low impedance when a signal of an L level is being output from the output node on the opposite side, and attains a high impedance when a signal of an H level is being output from the output node on the opposite side. This may make the rise of the output signal faster after the emitter follower transistor turns off without delaying the fall of the output signal.

Figure 5A:
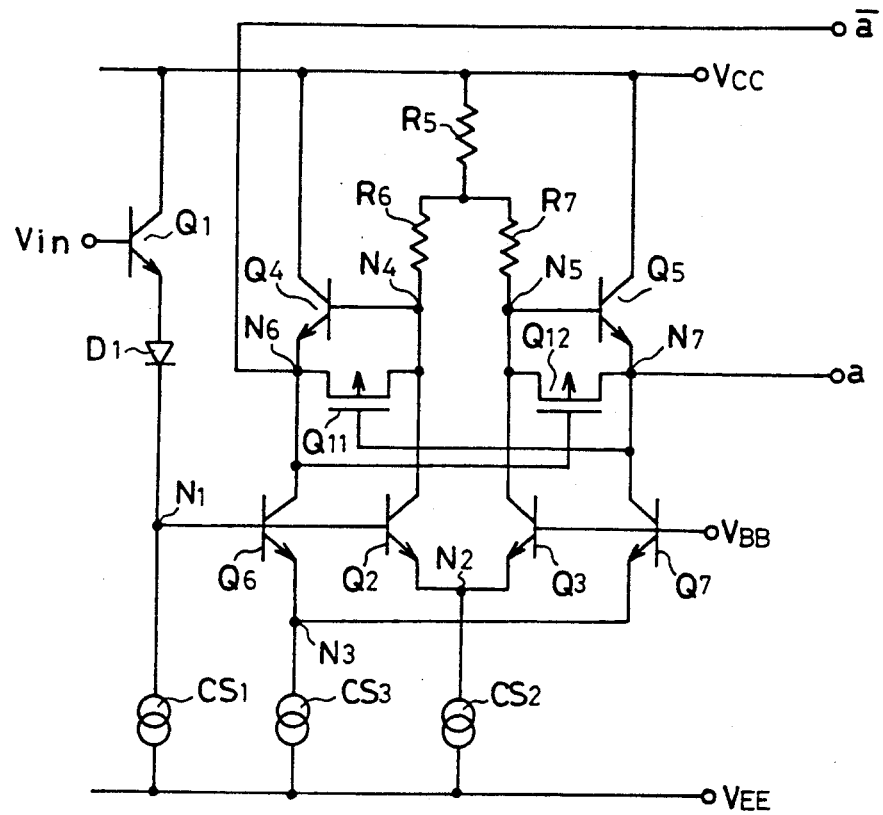
FIG. 5A is a circuit diagram of an ECL buffer circuit in accordance with a fifth embodiment of the present invention.
Figure 5B:
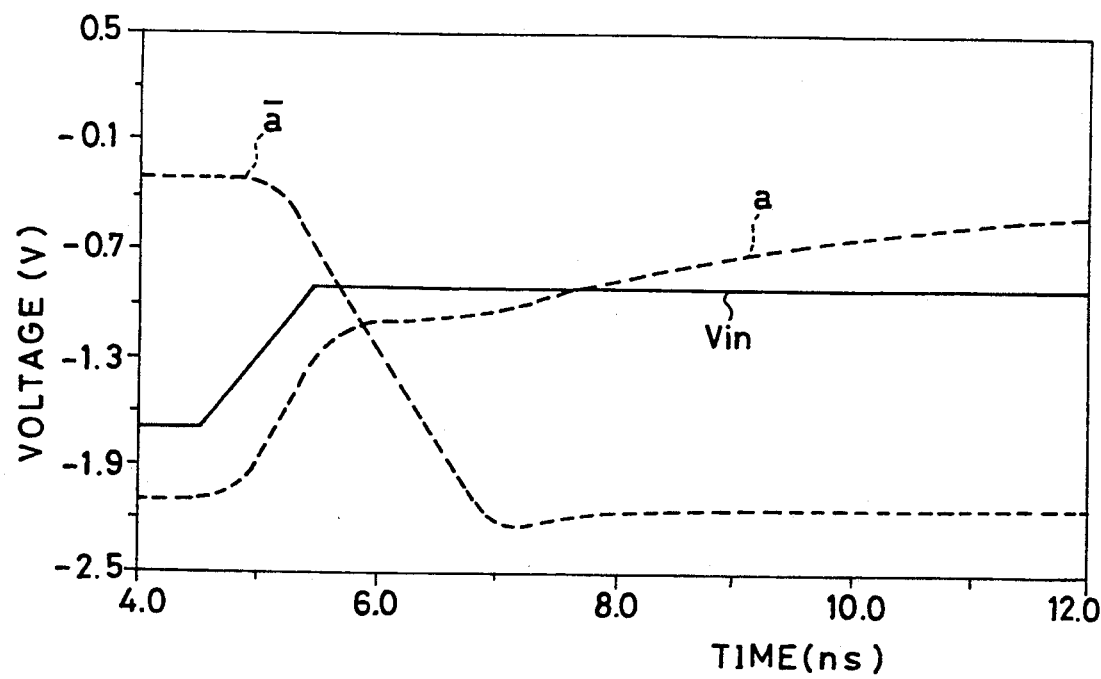
FIG. 5B is a waveform diagram of an input and an output signals of the fifth embodiment.

FIG. 5A is a circuit diagram of an ECL buffer circuit in accordance with a fifth embodiment of the present invention, and FIG. 5B is a waveform diagram of an input signal and an output signal in the ECL buffer circuit.

The ECL buffer circuit of FIG. 5A is different from the ECL buffer circuit of FIG. 4A in that R5 to R7 are provided in place of the resistors R1, R2, as in the embodiment of FIG. 2A.

As shown in FIG. 5B, in the embodiment of FIG. 5A, the amplitude of the output signal is small as in the embodiment of FIG. 2A. The switching speed becomes higher relative to that in the embodiment of FIG. 4A.

The operation of the embodiment in FIG. 5A is the same as that of FIG. 4A.

Figure 6A:
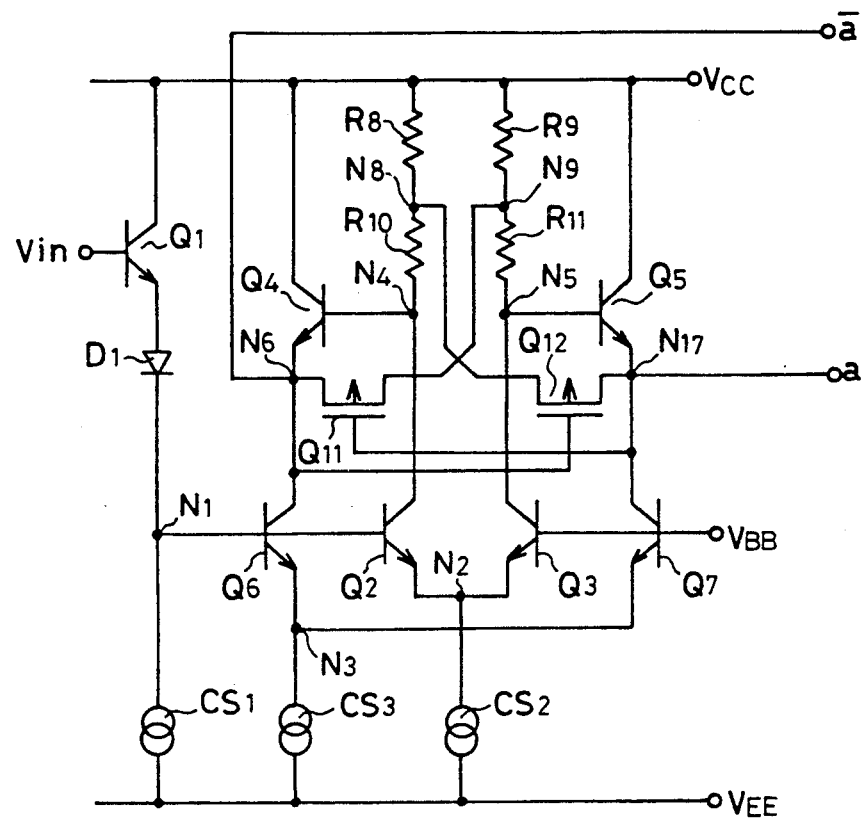
FIG. 6A is a circuit diagram of an ECL buffer circuit in accordance with a sixth embodiment of the present invention.
Figure 6B:
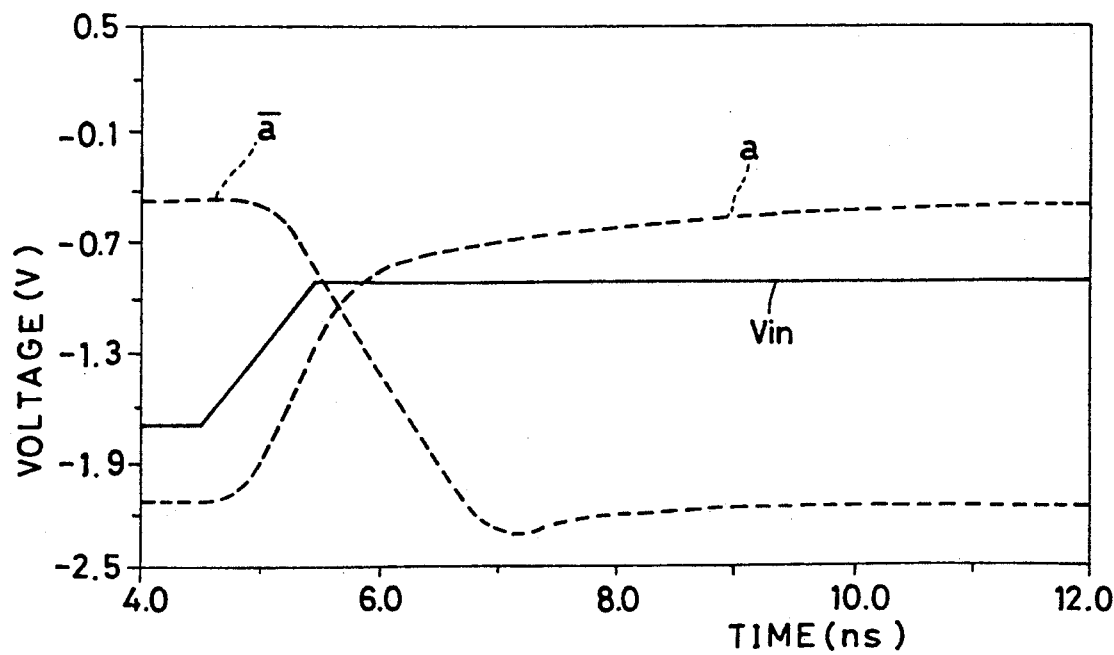
FIG. 6B is a waveform diagram of an input and output signals of the sixth embodiment.

FIG. 6A is a circuit diagram of an ECL buffer circuit in accordance with a sixth embodiment of the present invention, and FIG. 6B is a waveform diagram of an input signal and an output signal in the ECL buffer circuit.

The ECL buffer circuit of FIG. 6A is different from the ECL buffer circuit of FIG. 4A in that resistors R8 to R11 are provided in place of the resistors R1, R2 as in the embodiment of FIG. 3A. The transistor Q11 is connected between the node N6 and the node N9 with the gate connected to the node N7. The transistor Q12 is connected between the node N7 and the node N8 with the gate connected to the node N6.

In the embodiment of FIG. 6A, as in the embodiment of FIG. 3A, the output signal rapidly rises from the potential of an L level to −0.8 V by way of the emitter follower transistor (see FIG. 6B). In addition, in the same way as the embodiments of FIG. 4A and FIG. 5A, it is possible to make the rise of the output signal faster after the emitter flower transistor turns off without delaying the fall of the output signal.

The fundamental operation of the embodiment of FIG. 6A is the same as that of FIG. 4A.

Figure 7A:
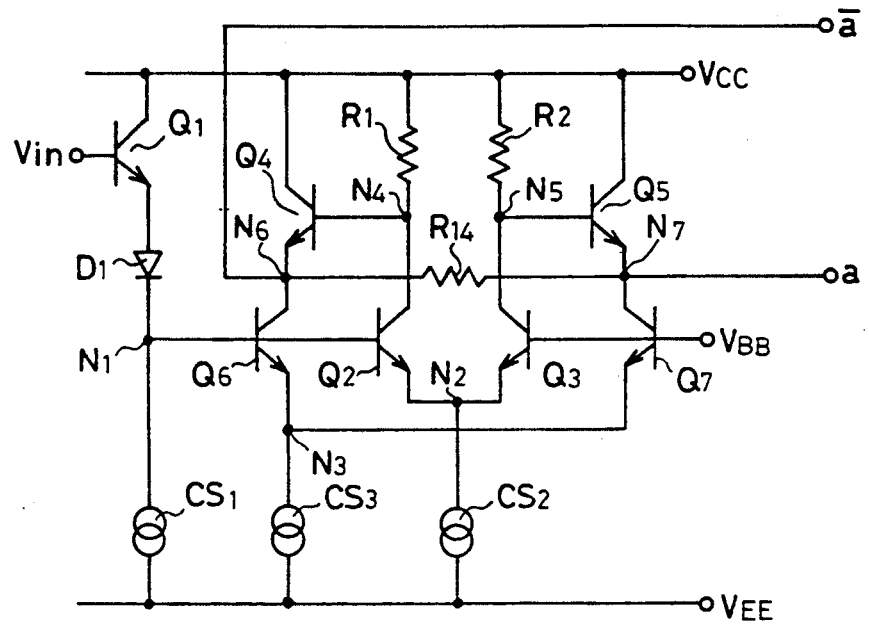
FIG. 7A is a circuit diagram of an ECL buffer circuit in accordance with a seventh embodiment of the present invention.
Figure 7B:
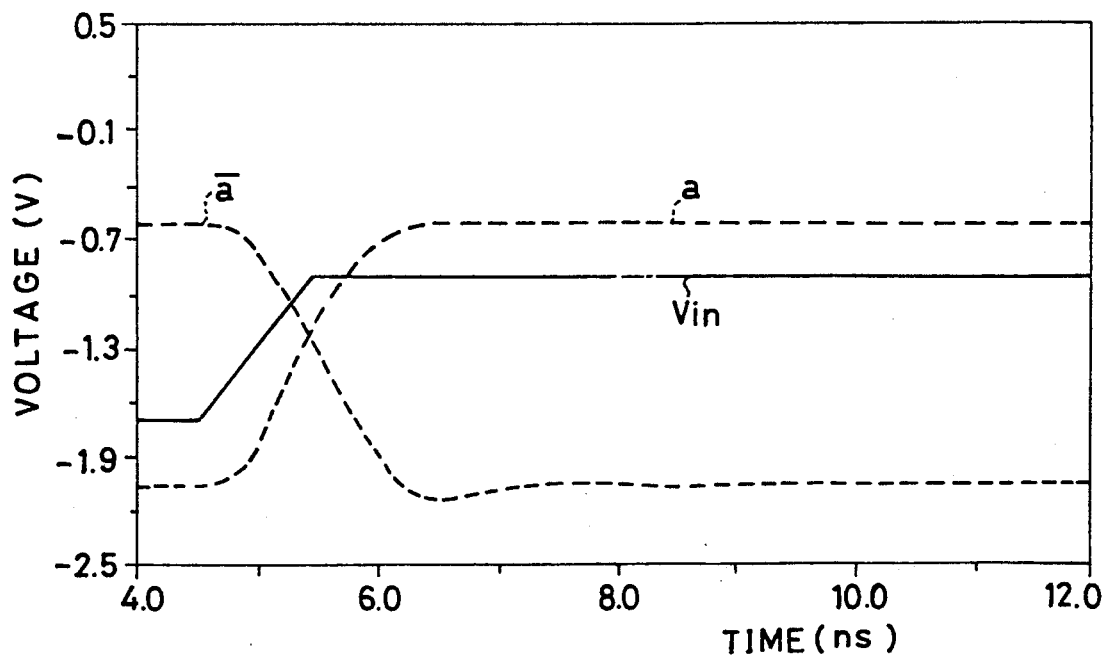
FIG. 7B is a waveform diagram of an input and an output signals of the seventh embodiment.

FIG. 7A is a circuit diagram of an ECL buffer circuit in accordance with a seventh embodiment of the present invention, and FIG. 7B is a waveform diagram of an input signal and an output signal in the ECL buffer circuit.

The ECL buffer circuit of FIG. 7A is different from the ECL buffer circuit of FIG. 1A in that resistors R14 is provided in place of the resistors R3, R4. The resistor R14 is connected between the node N6 and the N7.

In the embodiment of FIG. 7A, the emitter follower transistor which provides a signal of an H level does not turn off completely by connecting the resistor R14 for by-pass between two output nodes N6, N7 from which a complementary output signal is derived. Therefore, there is a small amount of current through the emitter follower transistor which drives an output signal of an H level, thereby avoiding an excess rise of the output signal level. Accordingly, as shown in FIG. 7B, the output potential is constant when a certain period of time has passed.

For example, in the case of a transistor through which a current of 1 mA flows in a normal on state (the base-emitter voltage is 0.8 V), in order for the H level of the output signal to be constant at $-0.6$ V, a parameter is set so that a current of about 1 μA flows as a load through the transistor which drives an output signal of an H level.

Figure 18A:
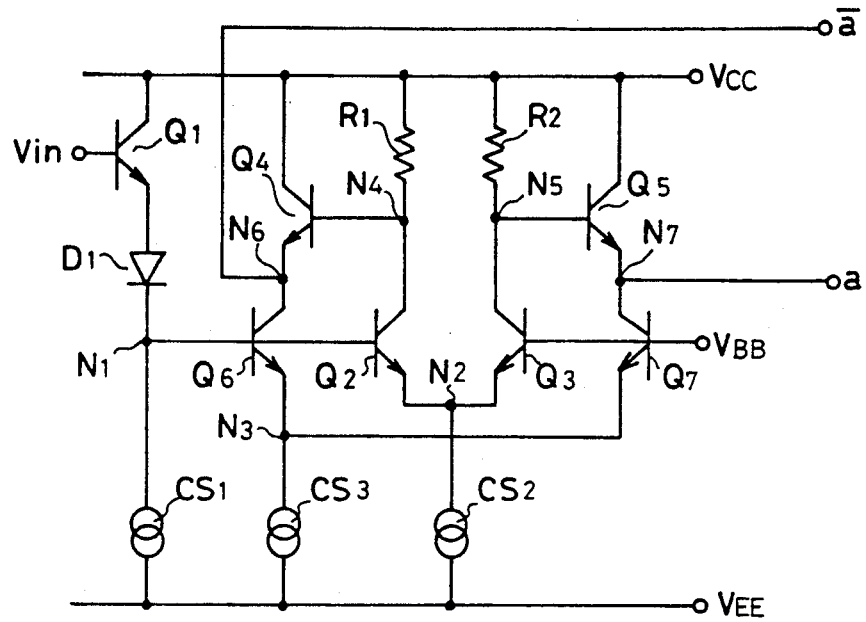
FIG. 18A is a circuit diagram of a second conventional buffer circuit.
Figure 18B:
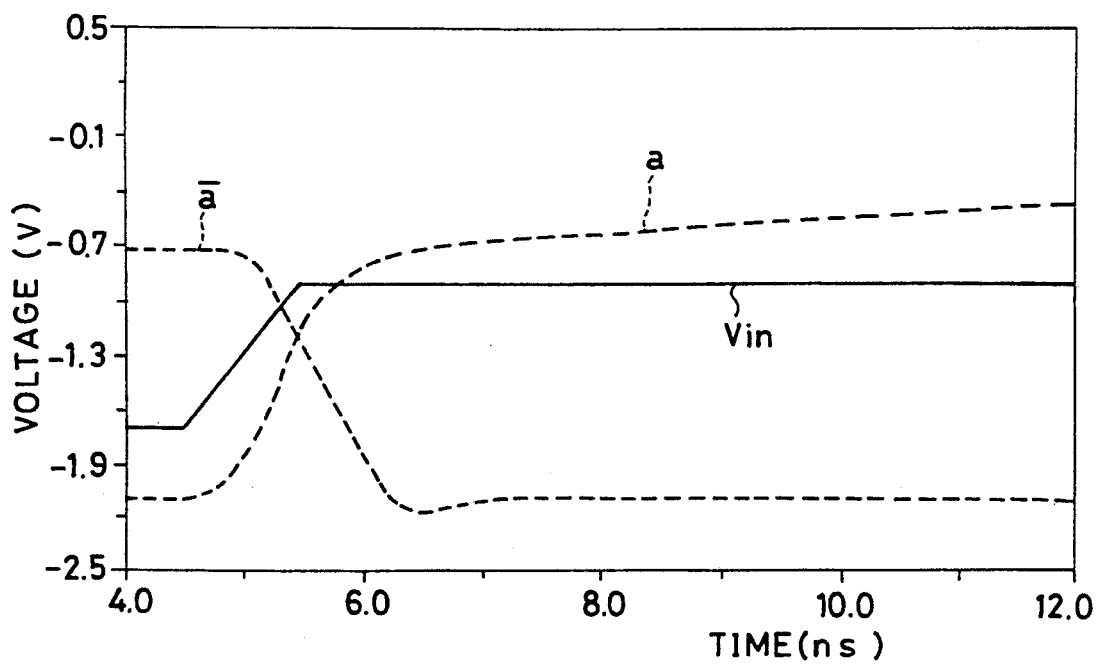
FIG. 18B is a waveform diagram of an input and an output signals of a second conventional ECL buffer circuit.
Figure 19A:
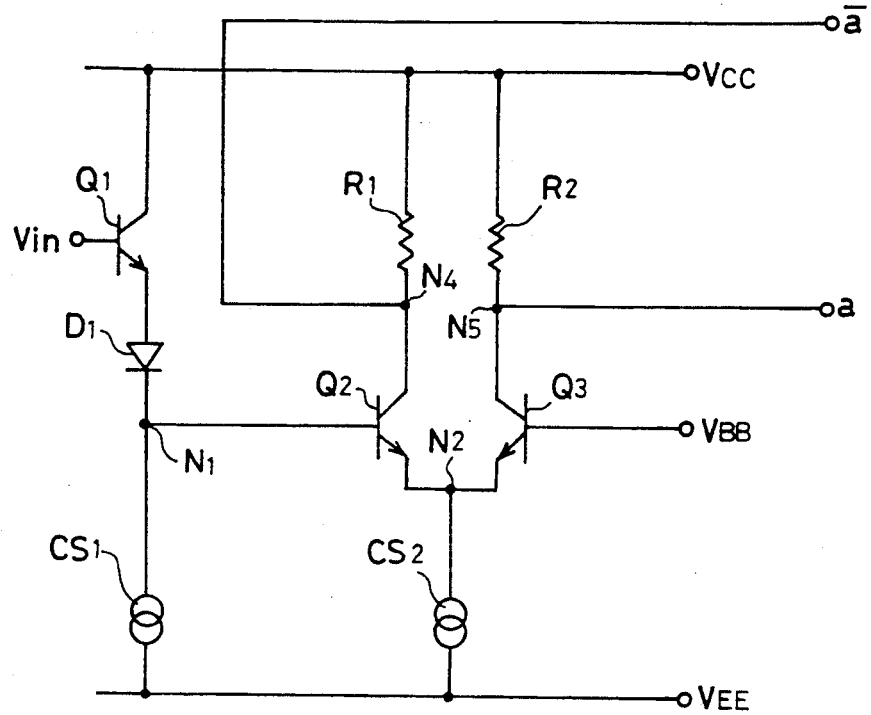
FIG. 19A is a circuit diagram of a third conventional ECL buffer circuit.
Figure 19B:
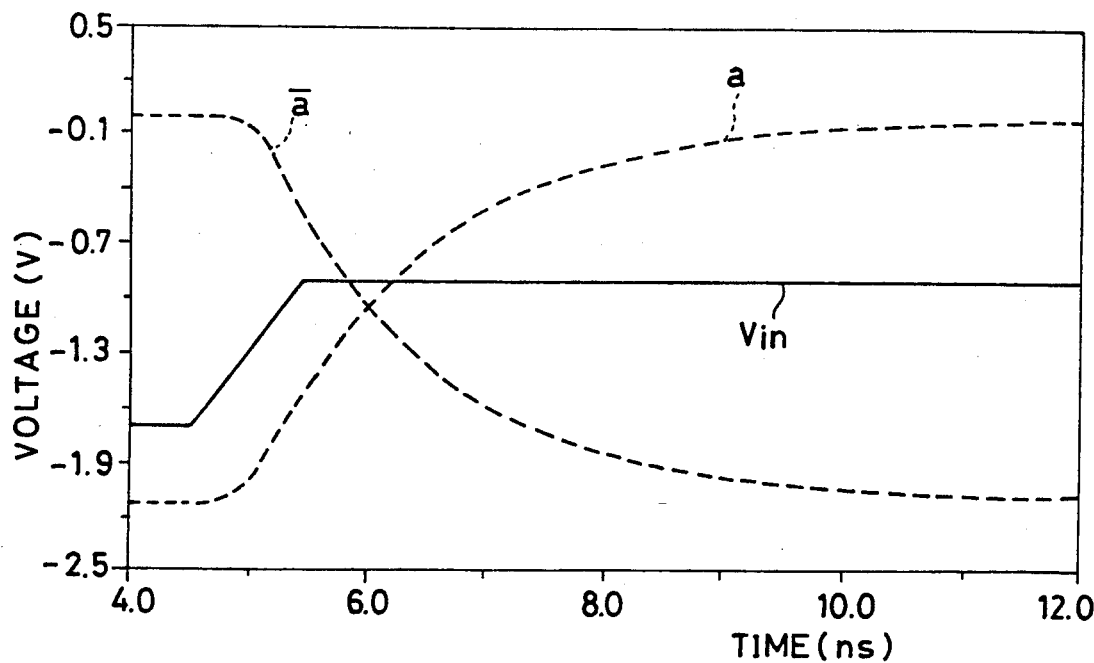
FIG. 19B is a waveform diagram of an input and an output signals of a third conventional ECL buffer circuit.
Figure 20A:
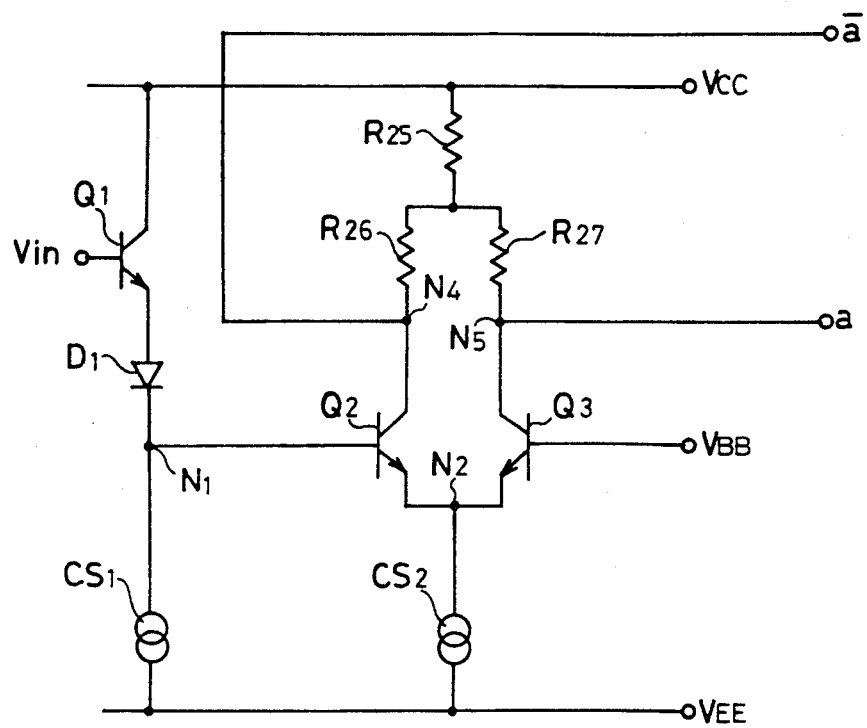
FIG. 20A is a circuit diagram of a fourth conventional ECL buffer circuit.
Figure 20B:
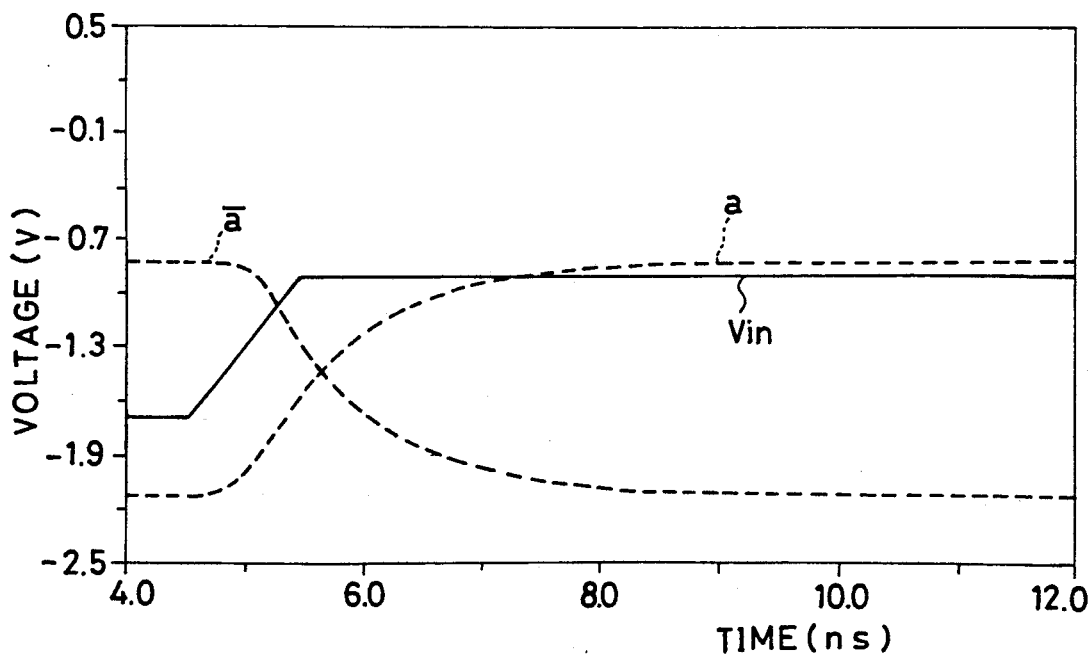
FIG. 20B is a waveform diagram of an input and an output signals of a fourth conventional ECL buffer circuit.

In accordance with the embodiment of FIG. 7A, the amplitude of the output signal is made smaller only by adding one resistor to the second conventional ECL buffer circuit shown in FIG. 18A, and the output signal is also made stable at an H level within a short period of time.

Figure 8A:
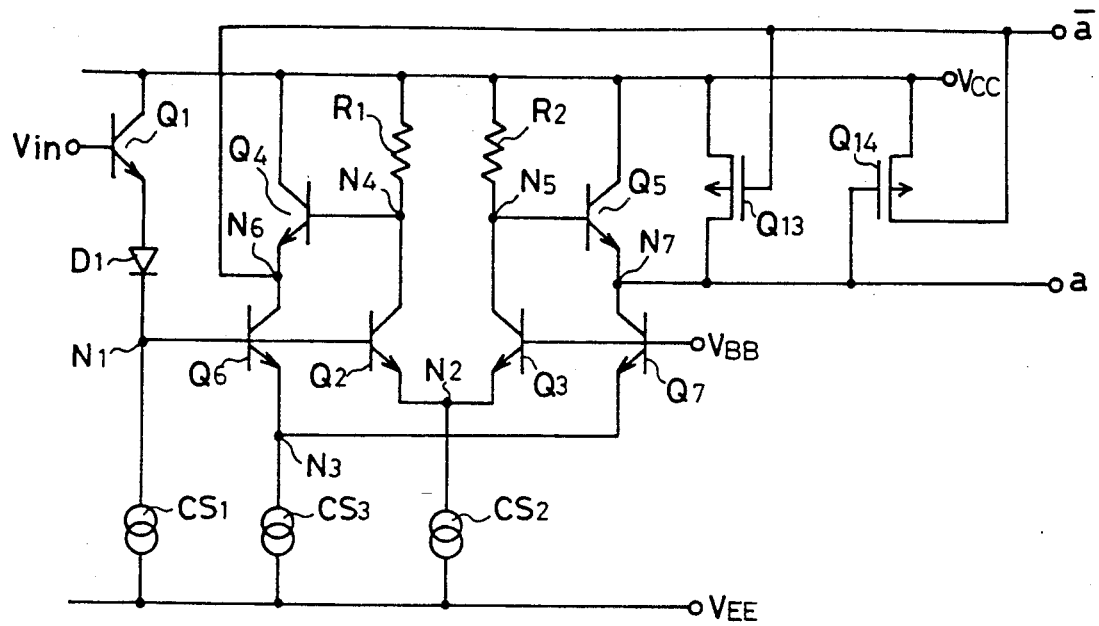
FIG. 8A is a circuit diagram of an ECL buffer circuit in accordance with an eighth embodiment of the present invention.
Figure 8B:
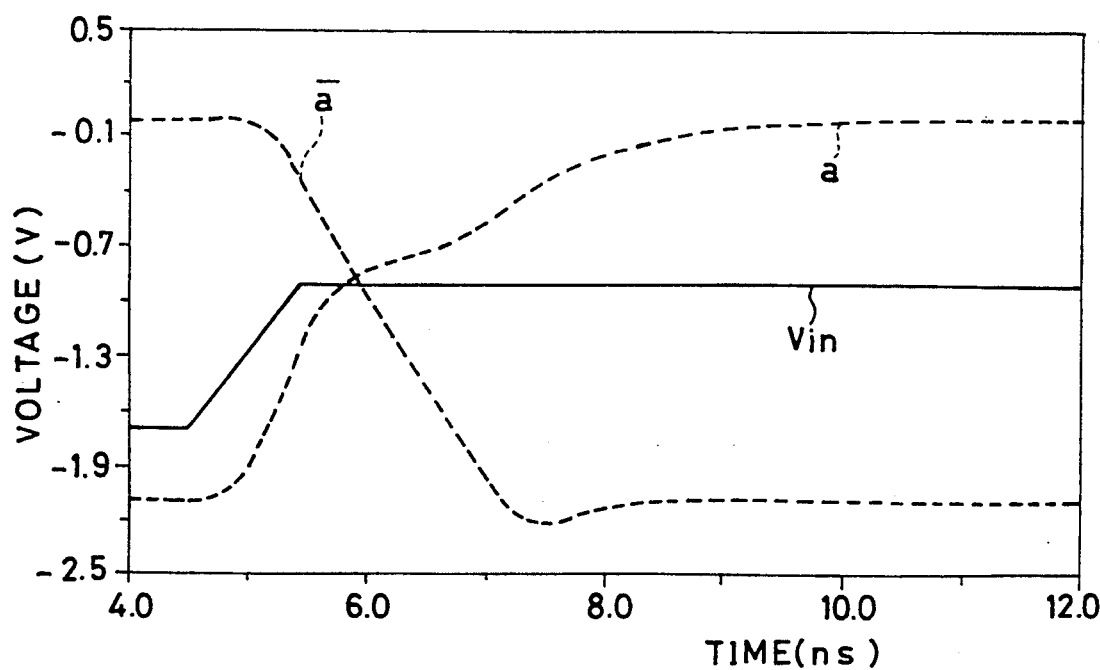
FIG. 8B is a waveform diagram of an input and an output signals of the eighth embodiment.

FIG. 8A is a circuit diagram of an ECL buffer circuit in accordance with an eighth embodiment of the present invention, and FIG. 8B is a waveform diagram of an input signal and an output signal of the ECL buffer circuit.

The ECL buffer circuit of FIG. 8A is different from the ECL buffer circuit of FIG. 1A in that PMOS transistors Q13, Q14 are provided in place of the resistors R3, R4. The transistor Q13 is connected between the ground terminal and the node N7 with the gate connected to the node N6. The transistor Q14 is connected between the ground terminal and the node N6 with the gate connected to the node N7.

The PMOS transistors Q13, Q14 function as a variable impedance. For example, when the output signal a from the node N7 is at an H level, the output signal $\bar{a}$ from the node N6 is at an L level. The transistor Q14 therefore falls in a high impedance state, and the transistor Q13 falls in a low impedance state. As a result, the H level of the output signal a, as shown in FIG. 8B, becomes almost equal to the ground voltage $V_{CC}$. The transistor Q14 is in a high impedance state so that the output signal $\bar{a}$ is not affected by the voltage of the ground terminal.

Thus, in accordance with the embodiment of FIG. 8A, it is possible to raise the voltage of the output signal at an H level to the ground voltage $V_{CC}$ in a short period of time.

Figure 9A:
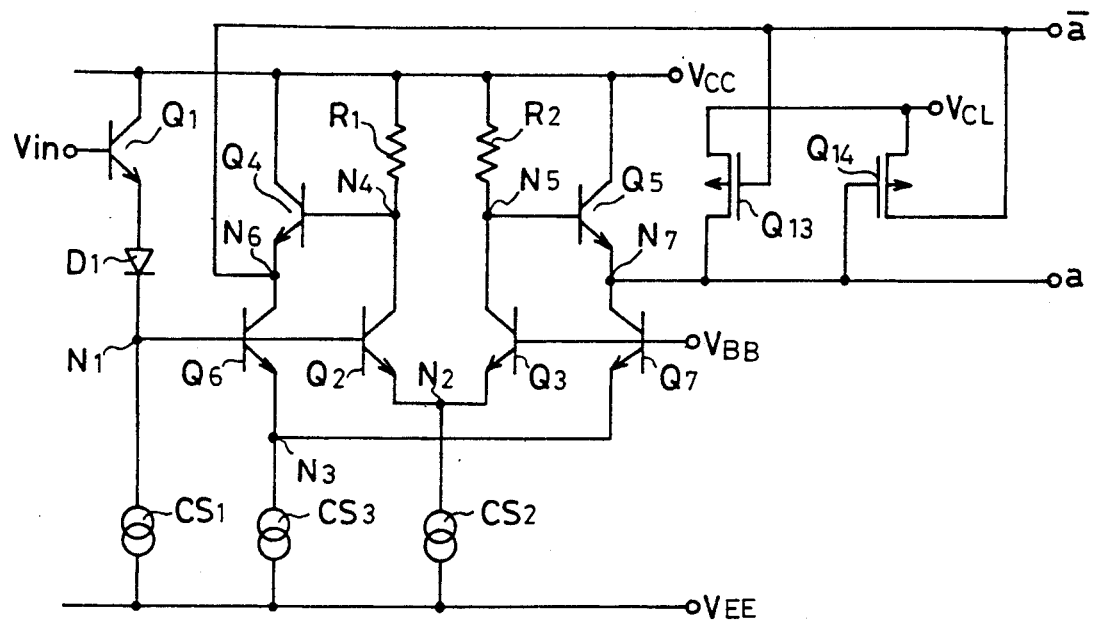
FIG. 9A is a circuit diagram of an ECL buffer circuit in accordance with a ninth embodiment of the present invention.
Figure 9B:
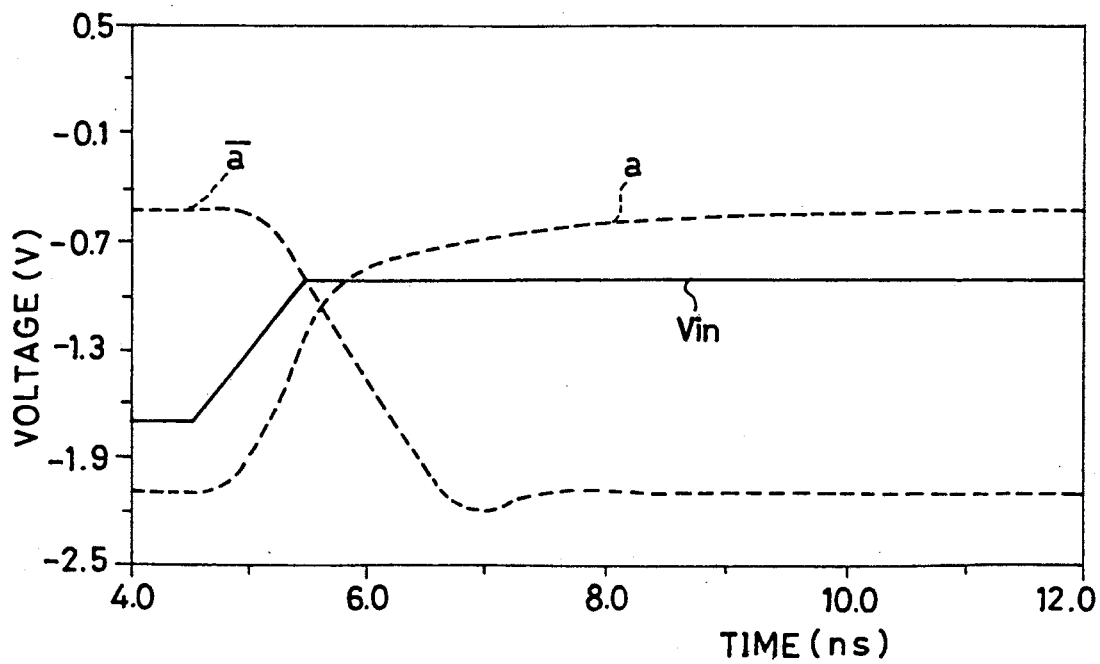
FIG. 9B is a waveform diagram of an input and an output signals of the ninth embodiment.

FIG. 9A is a circuit diagram of an ECL buffer circuit in accordance with a ninth embodiment of the present invention, and FIG. 9B is a waveform diagram of an input signal and an output signal in the ECL buffer circuit.

The ECL buffer circuit of FIG. 9A is different from the ECL buffer circuit of FIG. 8A in that the sources of the transistors Q13, Q14, instead of being connected to the ground terminal, are connected to a terminal which receives the potential $V_{CL}$ a little lower than the ground potential $V_{CC}$.

In the embodiment of FIG. 9A, a shown in the waveform diagram of FIG. 9B, the H level of the output signal becomes almost equal to the potential $V_{CL}$. Thereby, the amplitude of the output signal is made small, and the switching speed is improved.

Figure 10:
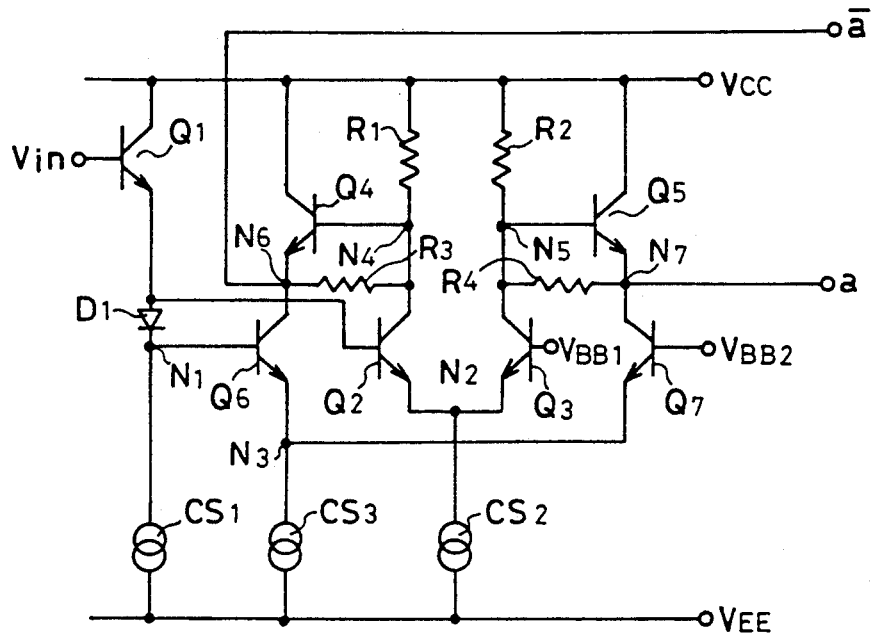
FIG. 10 is a circuit diagram of an ECL buffer circuit in accordance with a tenth embodiment of the present invention.

FIG. 10 is a circuit diagram of an ECL buffer circuit in accordance with a tenth embodiment of the present invention.

The ECL buffer circuit of FIG. 10 is different from the ECL buffer circuit of FIG. 1A in a way as follows: the base of the transistor Q2 is connected to the anode of the level-shift diode D1; the base of the transistor Q3 receives a first reference voltage $V_{BB1}$, and the base of the transistor Q3 receives a second reference voltage $V_{BB2}$, where the first reference voltage $V_{BB1}$ is set to an intermediate voltage between an H level and an L level of the base voltage of the transistor Q2, and the second reference voltage $V_{BB2}$ is set to an intermediate voltage between an H level and an L level of the base voltage of the transistor Q6; therefore, there is a relationship of $V_{BB2}=V_{BB1}-V_{BE}$.

The collector voltages of the transistors Q2, Q3 are each higher than those of the transistors Q6, Q7 by the base-emitter voltage of the transistors Q4, Q5 (0.8 V). Therefore, the transistors Q2, Q3 are not saturated even if the base voltages of the transistors Q2, Q3 are set to a voltage higher than the base voltages of the transistors Q6, Q7.

For example, the first reference voltage $V_{BB1}$ is set to $-2.1$ V, and the second reference voltage $V_{BB2}$ is set to $-2.9$ V. When the input signal Vin is at $-0.8$ V, the base voltage of the transistor Q2 is $-1.6$ V, and the base voltage of the transistor Q6 is $-2.4$ V. The voltage of the node N4 is $-1.2$ V, and the voltage of the node N6 is $-2.0$ V. At this time, the voltage of the nodes N5, N7 is 0 V.

In accordance with the embodiment of FIG. 10, the range voltage of the transistors Q2, Q3 is set to a high level so that the transistor in the constant current source CS2 is not saturated even if the power supply voltage $V_{EE}$ is set high. According to the ECL standard, $V_{EE}$ is $-5.2$ V or $-4.5$ V while it is possible to set the power supply voltage $V_{BE}$ to any of $-5.2$ V and $-4.5$ V in the embodiment of FIG. 10.

In the embodiment of FIG. 10, the operating voltage range is expanded. The operation of the embodiment of FIG. 10 is the same as that of FIG. 1A.

Figure 11:
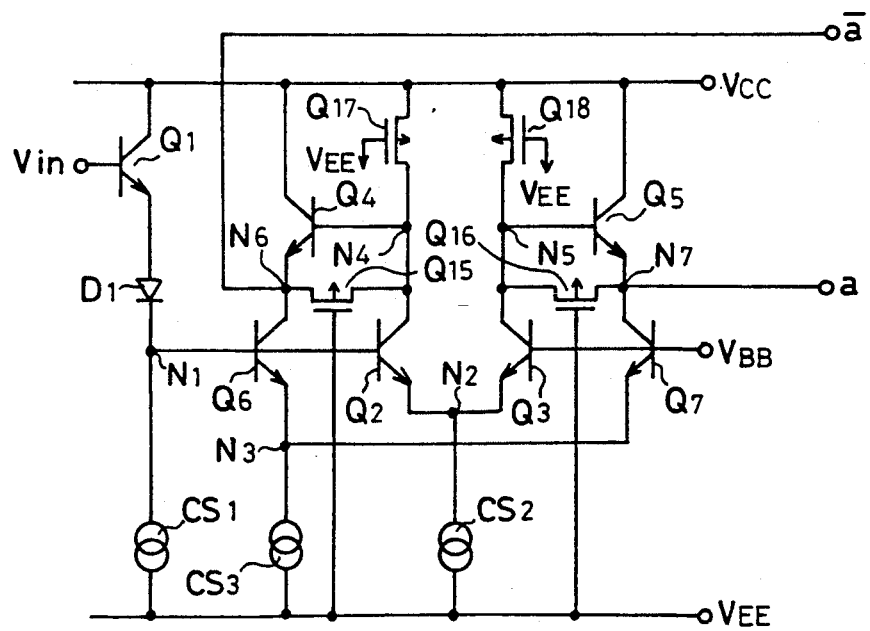
FIG. 11 is a circuit diagram of an ECL buffer circuit in accordance with an eleventh embodiment of the present invention.

FIG. 11 is a circuit diagram of an ECL buffer circuit in accordance with an eleventh embodiment of the present invention.

In the ECL buffer circuit of FIG. 11, the resistors R1 to R4 of the ECL buffer circuit in FIG. 1A are replaced with the on-resistance of the PMOS transistors Q15 to Q18. The gates of the PMOS transistors Q15 to Q18 are connected to the power supply terminal.

The operation of the embodiment of FIG. 11 is the same as that of FIG. 1A.

The present invention, as will be seen in the following, may also be applied to an ECL buffer circuit of multiple inputs.

Figure 12A:
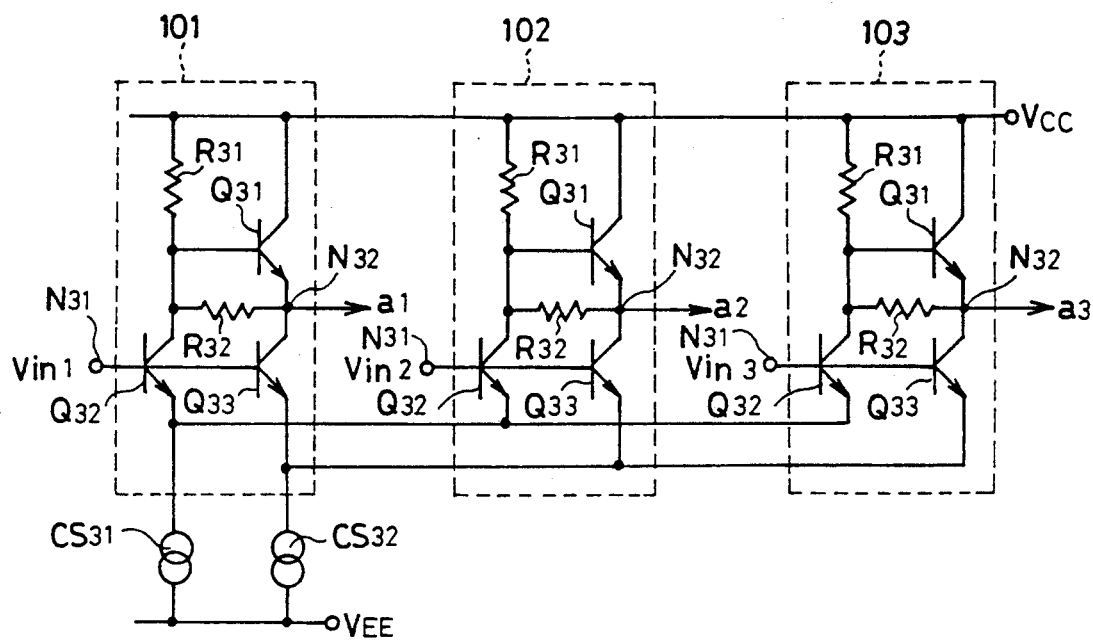
FIG. 12A is a circuit diagram of an ECL buffer circuit in accordance with a twelfth embodiment of the present invention.

FIG. 12A is a circuit diagram of an ECL buffer circuit in accordance with a twelfth embodiment of the present invention. This embodiment is an example of the case in which the embodiment of FIG. 1A is extended to an ECL buffer circuit of multiple inputs.

The ECL buffer circuit of FIG. 12A comprises three buffer circuits 101, 102, 103, and a first and a second constant current sources CS31, CS32. Each of the buffer circuits 101, 102, 103 comprises resistors R31, R32 and transistors Q31 to Q33. The collector of the transistor Q31 is connected to the ground terminal with the emitter connected to the output node N32. The resistor R31 is connected between the ground terminal and the base of the transistor Q31. The resistor R32 is connected between the base and the emitter of the transistor Q31. The base of the transistor Q32 is connected to the input node N31, the collector is connected to the base of the transistor Q31, and the emitter is connected to the first constant current source CS31. The base of the transistor Q33 is connected to the input node N31, the collector is connected to the output node N32, and the emitter is connected to the second constant current source CS32.

The input nodes N31 of the buffer circuits 101, 102, 103 each receive a first, a second and a third input signals Vin1, Vin2, Vin3. The output nodes N32 of the buffer circuits 101, 102, 103 each provide output signals a1, a2, a3.

For example, when the potential of the first input signal Vin1 is higher than those of the second and the third input signals Vin2, Vin 3, the transistors Q32, Q33 in the buffer circuit 101 turn on, and the output signal a1 attains an L level. At this time, the output signals a2, a3 attain an H level.

The precise operation of each of the buffer circuits 101, 102, 103 is similar to that of the embodiment of FIG. 1.

Figure 12B:
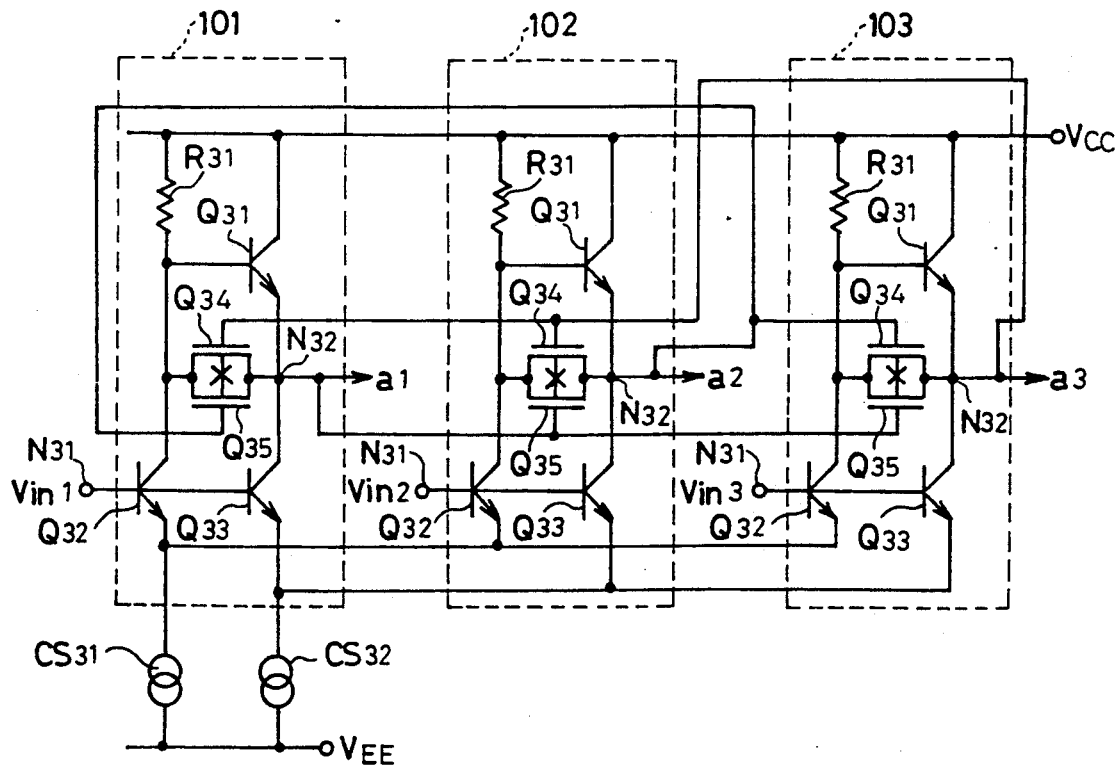
FIG. 12B is a circuit diagram of an ECL buffer circuit of a thirteenth embodiment of the present invention.

FIG. 12B is a circuit diagram of an ECL buffer circuit in accordance with a thirteenth preferred embodiment of the present invention. This embodiment is an example of the case in which the embodiment of FIG. 4A is expanded into an ECL buffer circuit of multiple inputs.

In the ECL buffer circuit of FIG. 12B, each of the three buffer circuits 101, 102, 103 comprises PMOS transistors Q34, Q35 in place of the resistor R32 shown in FIG. 12A. The transistors Q34, Q35 are connected between the base and the emitter of the transistor Q31. The gates of the transistors Q34 in the buffer circuits 101, 102 are connected to the output node N32 in the buffer circuit 103. The gate of the transistor Q34 in the buffer circuit 103 is connected to the output node N32 of the buffer circuit 102. The gate of the transistor Q35 in the buffer circuit 101 is connected to the output node N32 of the buffer circuit 102. The gates of the transistors Q35 in the buffer 102, 103 are connected to the output node N32 in the buffer circuit 101.

For example, the potential of the first input signal Vin1 is higher than those of the second and the third input signals Vin2, Vin3, the transistors Q32, Q33 in the buffer circuit 101 turn on. The output signal a1 thereby attains an L level, and the output signals a2, a3 attain an H level. As a result, the transistors Q34, Q35 in the buffer circuit 101 become in a high impedance state. In addition, the transistors Q34 in the buffer circuits 102, 103 become in a high impedance state, and the transistors Q35 become in a low impedance state.

Meanwhile, the precise operation of each of the buffer circuits 101, 102, 103 is similar to that of the embodiment of FIG. 4A.

Figure 12C:
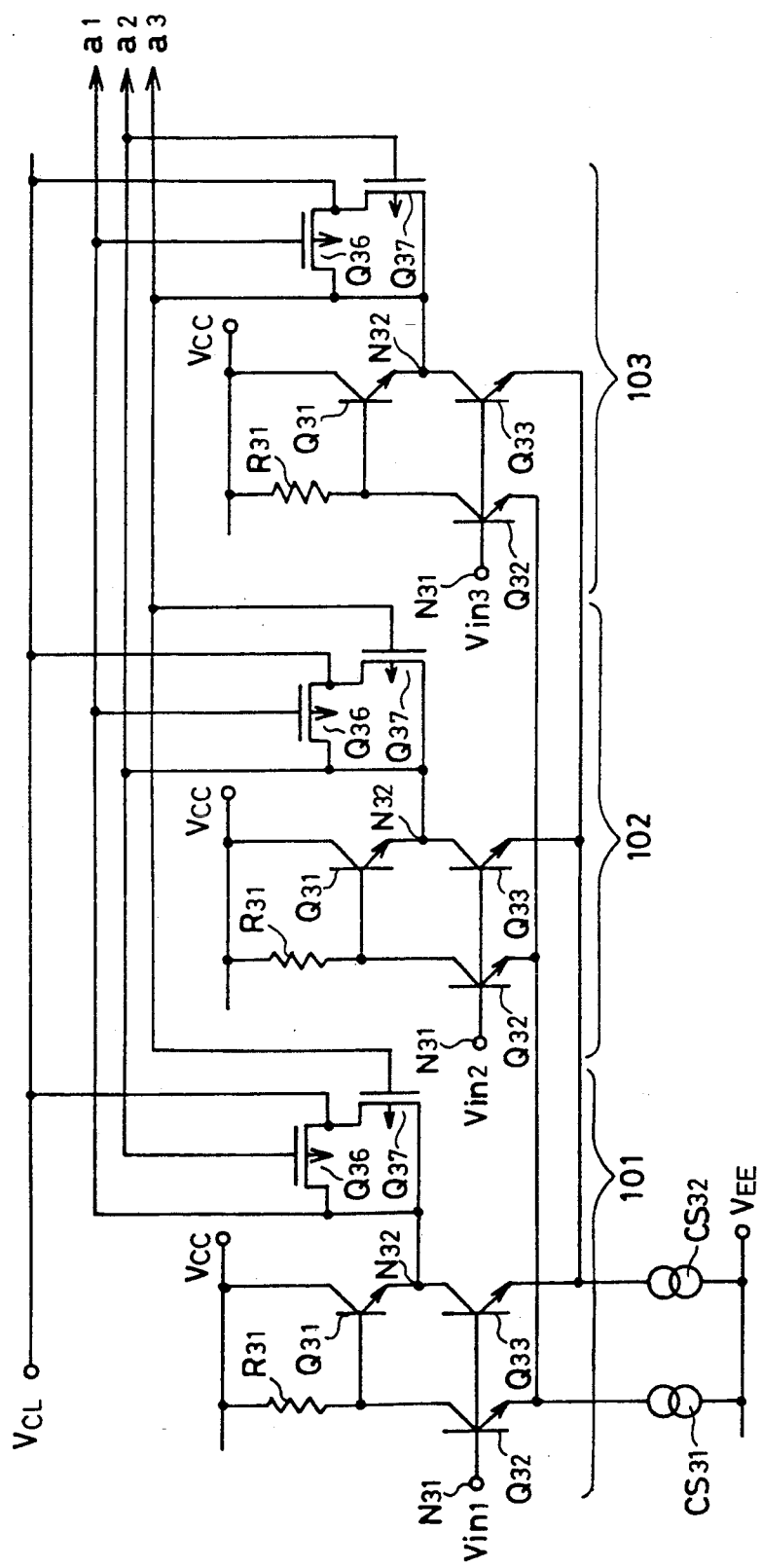
FIG. 12C is a circuit diagram of an ECL buffer circuit in accordance with a fourteenth embodiment of the present invention.

FIG. 12C is a circuit diagram of an ECL buffer circuit in accordance with a fourteenth embodiment of the present invention. This embodiment is an example of the case in which the embodiment of FIG. 9A is expanded into an ECL buffer circuit of multiple inputs.

In FIG. 12C, each of the buffer circuits 101, 102, 103 comprises PMOS transistors Q36, Q37. The transistors Q36, Q37 are connected between the output node N32 and a terminal which receives a predetermined voltage $V_{CL}$. The gate of the transistor Q36 in the buffer circuit 101 and the gate of the transistor Q37 in the buffer circuit 103 are connected to the output node N32 in the buffer circuit 102. The gate of the transistor Q36 in the buffer circuit 102 and the gate of the transistor Q36 in the buffer circuit 103 are connected to the output node N32 in the buffer circuit 101. The gate of the transistor Q37 in the buffer circuit 101 and the gate of the transistor Q37 in the buffer circuit 102 are connected to the output node N32 in the buffer circuit 103.

For example, when the potential of the first input signal Vin1 is higher than that of the second and the third input signals Vin2, Vin3, then the transistors Q32, Q33 in the buffer circuit 101 turn on. The output signal a1 thereby attains an L level, and the output signals a2, a3 attain an H level. As a result, the transistors Q36, Q37 in the buffer circuit 101 fall in a high impedance state. In addition, the transistors Q36 in the buffer circuits 102, 103 fall in a low impedance state, and the transistors Q37 fall in a high impedance state.

Meanwhile, the precise operation of each of the buffer circuits 101, 102, 103 is similar to the embodiment of FIG. 9A.

Figure 13:
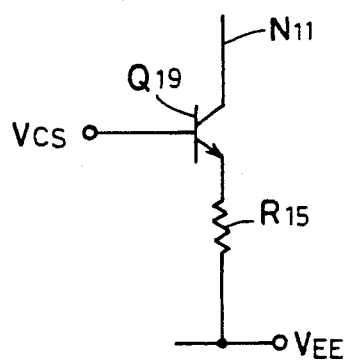
FIG. 13 is a diagram showing an example of a circuit configuration of a constant current source used in the embodiment of the present invention.

FIG. 13 is a diagram showing one example of a specific circuit configuration of constant current sources CS1, CS2, CS3 used in the ECL buffer circuit in the above described embodiment. The base of the transistor Q19 receives the reference voltage $V_{CS}$, the Collector is connected to the node N11, and the emitter is connected to the power supply terminal through a resistor R15. The node N11 is connected to the node N1, N2 or N3 of the ECL buffer circuit.

Figure 14:
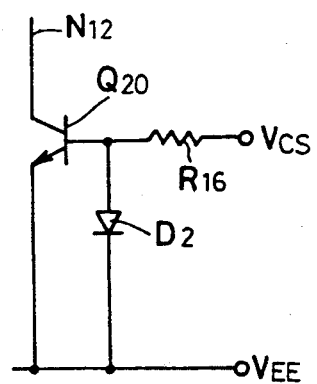
FIG. 14 is a diagram showing another example of a circuit configuration of a constant current source used in the embodiment of the present invention.

FIG. 14 is a diagram showing another example of a specific circuit configuration of constant current sources CS1, CS2, CS3 used in the ECL buffer circuit of the above described embodiment. The collector of the transistor Q20 is connected to the node N12, the emitter is connected to the power supply terminal, and the base receives the reference voltage $V_{CS}$ through a resistor R16. A diode D2 is connected between the base of the transistor Q20 and the power supply terminal. The node N12 is connected to the node N1, N2 or N3 of the ECL buffer circuit.

The constant current source of FIG. 13 is superior to that of FIG. 14 in terms of the accuracy of the current value. However, in the constant current source of FIG. 13, there is a voltage drop by the resistor R15 so that the transistor Q19 could be saturated if the power supply voltage $V_{EE}$ is raised. Therefore, in the case in which the range of the operational voltage is expanded, the constant current source of FIG. 14 is superior.

As the constant current sources CS1, CS2, CS3 in the above described embodiment, either the constant current source of FIG. 13 or of FIG. 14 may be used, taking account of various parameters. It is, however, preferred that the dispersion of the current values is as small as possible since the constant current source CS2 determines the amplitude of the output signal. Accordingly, as the constant current source CS2, preferably, the constant current source of FIG. 13 is used. Conversely, the accuracy of the current value of the constant current source CS3 may be not so good. Accordingly, as the constant current source CS3, the constant current source of FIG. 14 may be used.

Particularly, in the embodiment of FIG. 10, the constant current source of FIG. 13 may be used as the constant current source CS2, and the constant current source of FIG. 14 may be used as the constant current source CS3 since the potential of the node N2 is set to be high. This makes it possible to expand the range of the operational voltage while maintaining the accuracy of the current value of the constant current source CS2.

The current value of each current source is determined by the reference voltage $V_{CS}$, the negative voltage $V_{EE}$, the resistance value of the internal resistor R15 or R16.

Figure 15:
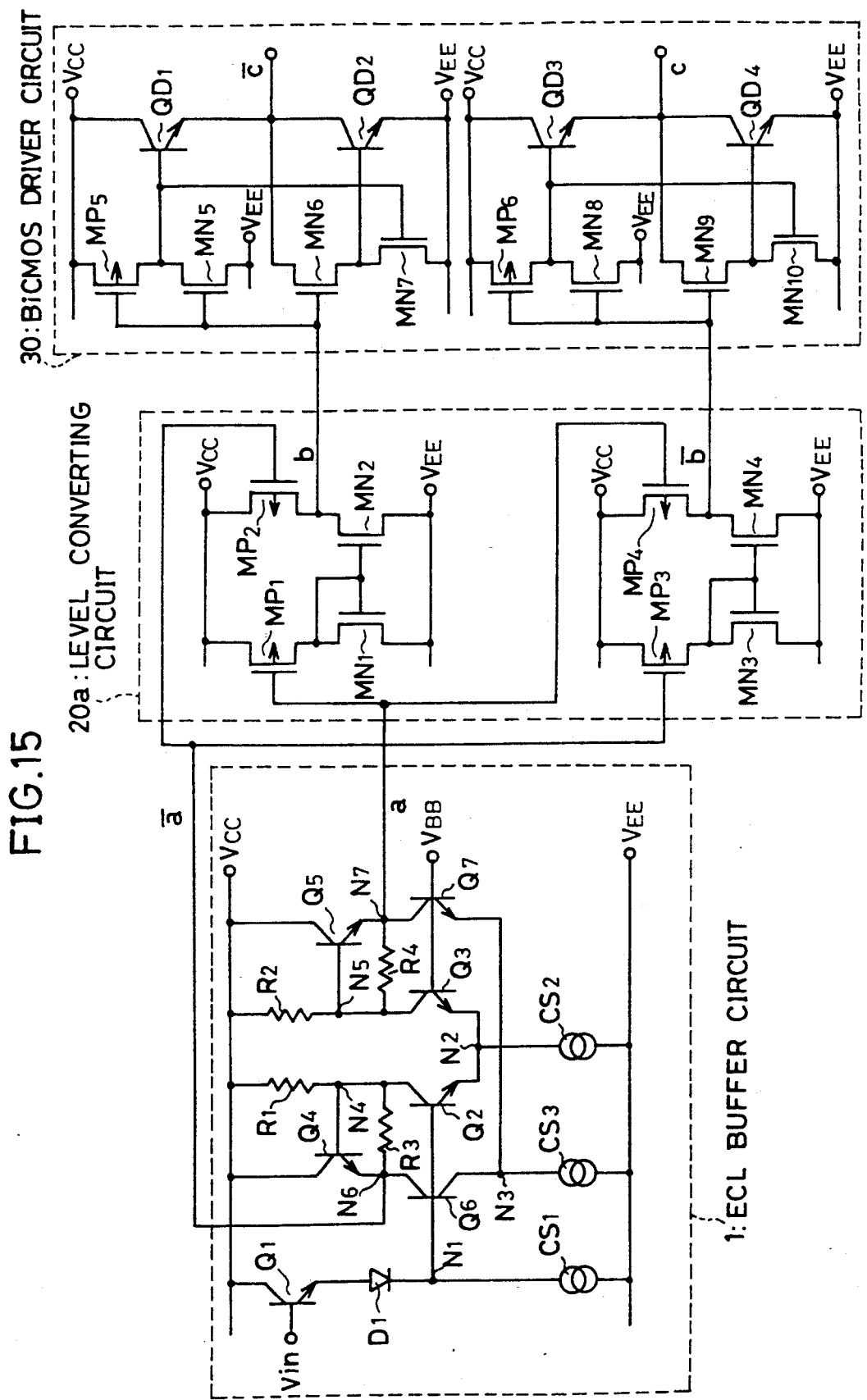
FIG. 15 is a diagram showing an example in which the ECL buffer circuit in accordance with the first embodiment is connected to a BiCMOS driver circuit through a level converting circuit.

FIG. 15 is showing an example in which the ECL buffer circuit of the first embodiment is connected to the BiCMOS driver circuit through the level converting circuit.

Figure 21:
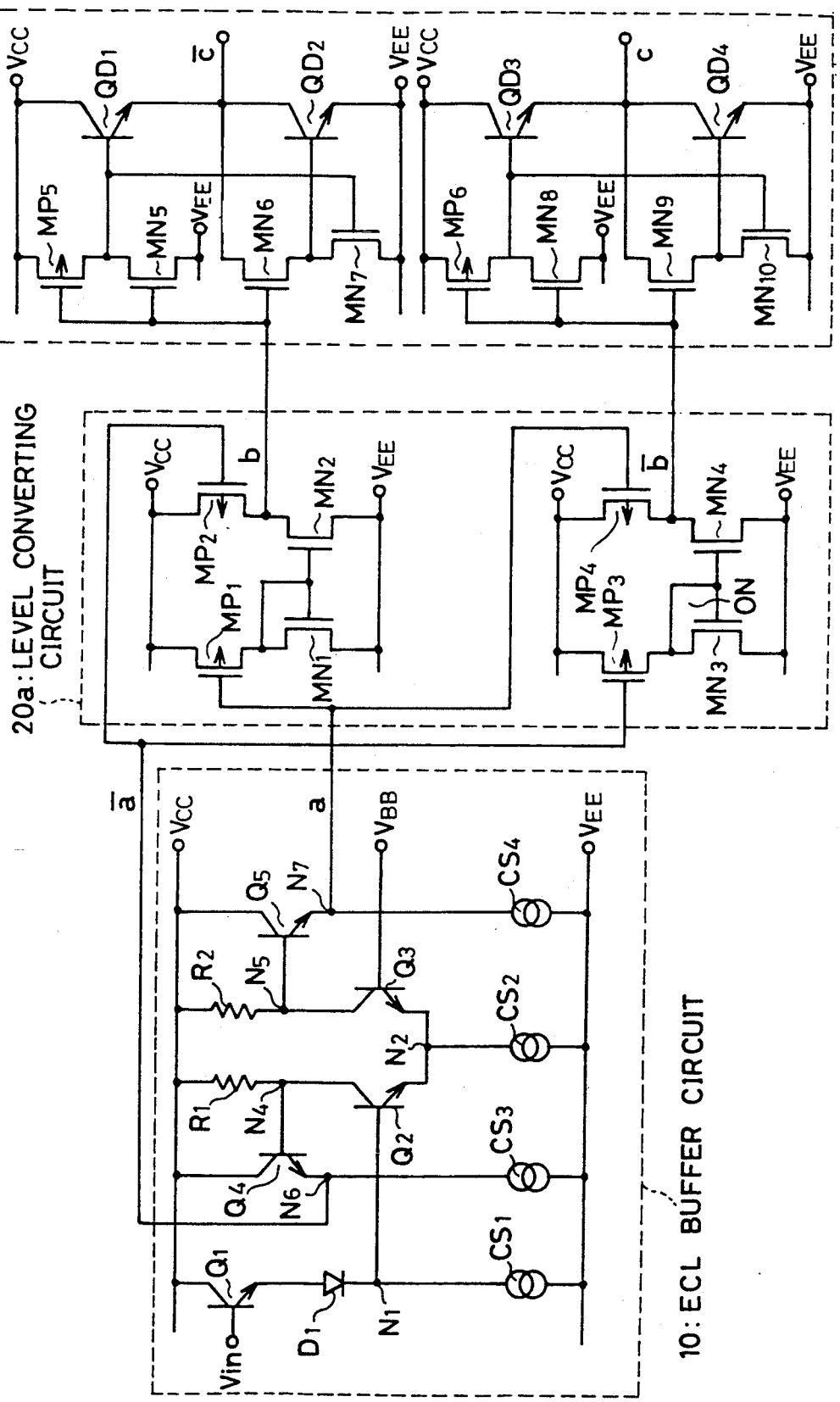
FIG. 21 is a diagram showing an example in which a first conventional ECL buffer circuit is connected to a BiCMOS driver circuit through a level converting circuit.

In FIG. 15, the ECL buffer circuit 1 shown in FIG. 1A is connected to the BiCMOS driver circuit 30 shown in FIG. 21 through the level converting circuit 20a shown in FIG. 21.

When the level of the input signal Vin at an ECL level changes from an L level ($-1.7$ V) to an H level ($-0.9$ V), as stated above, the output signal a of the ECL buffer circuit 1 almost attains an H level represented by $V_{CC}$, and the output signal a attains an L level represented by $V_{CC} - R_1 \cdot I2 - (1 + R_1/R_3) \cdot V_{BE}$.

Accordingly, in the level converting circuit 20a, the PMOS transistors MP1, MP4 which are provided with the output signal a completely turn off, and the PMOS transistors MP2, MP3 which are provided with the output signal $\bar{a}$ turn on. Thereby, the NMOS transistors MN1, MN2 turn off, and the NMOS transistors MN3, MN4 turn on. Accordingly, the level of the output signal b of the level converting circuit 20a changes from an L level (the negative voltage $V_{EE}$) to an H level (the ground voltage $V_{CC}$), and the level of the output signal $\bar{b}$ changes from an H level (the ground voltage $V_{CC}$) to an L level (the negative voltage $V_{BE}$).

Moreover, the level of the output signal c of the BiCMOS driver circuit 30 changes from an L level (the negative voltage $V_{EE} + V_f$) to an H level (the ground voltage $V_{CC} - V_f$), and the level of the output signal $\bar{c}$ changes from an H level (the ground voltage $V_{CC} - V_f$) to an L level (the negative voltage $V_{EE} + V_f$).

When the level of the input signal Vin changes from an H level ($-0.9$ V) to an L level ($-1.7$ V), as stated above, the output a of the ECL buffer circuit 1 attains an L level represented by $V_{CC} - R_2 \cdot I2 - (1 + R_2/R_4) \cdot V_{BE}$, the output signal $\bar{a}$ almost attains an H level represented by $V_{CC}$.

Therefore, in the level converting circuit 20a, the PMOS transistors MP1, MP4 turn on, and the PMOS transistors MP2, MP3 which are provided with the output signal $\bar{a}$ completely turn off. Thereby, the NMOS transistors MN1, MN2 turn on, and the NMOS transistors MN3, MN4 turn off. As a result, the level of the output signal b changes from an H level to an L level, and the level of the output signal $\bar{b}$ changes from an L level to an H level.

Moreover, the level of the output signal c of the BiCMOS driver circuit 30 changes from an H level to an L level, and the level of the output signal $\bar{c}$ changes from an L level to an H level.

Thus, in accordance with the ECL buffer circuit of the above mentioned embodiment, the H level of the output signals a, $\bar{a}$ almost attain the ground voltage $V_{CC}$ so that the PMOS transistor, which is provided with an output signal of an H level in the level converting circuit 20a, completely turns off. Therefore, even though threshold voltage of the PMOS transistor varies widely, no excess feed-through current flows in the level converting circuit 20a.

In addition, the output signals b, $\bar{b}$ of the level converting circuit 20a may swing fully from the ground voltage $V_{CC}$ to the negative voltage $V_{EE}$. That is, it can be said that the ECL buffer circuit of the above described embodiment has an advantage in terms of power consumption which respect to the dispersion of the threshold voltage of the PMOS transistor in the level converting circuit 20a.

Figure 22:
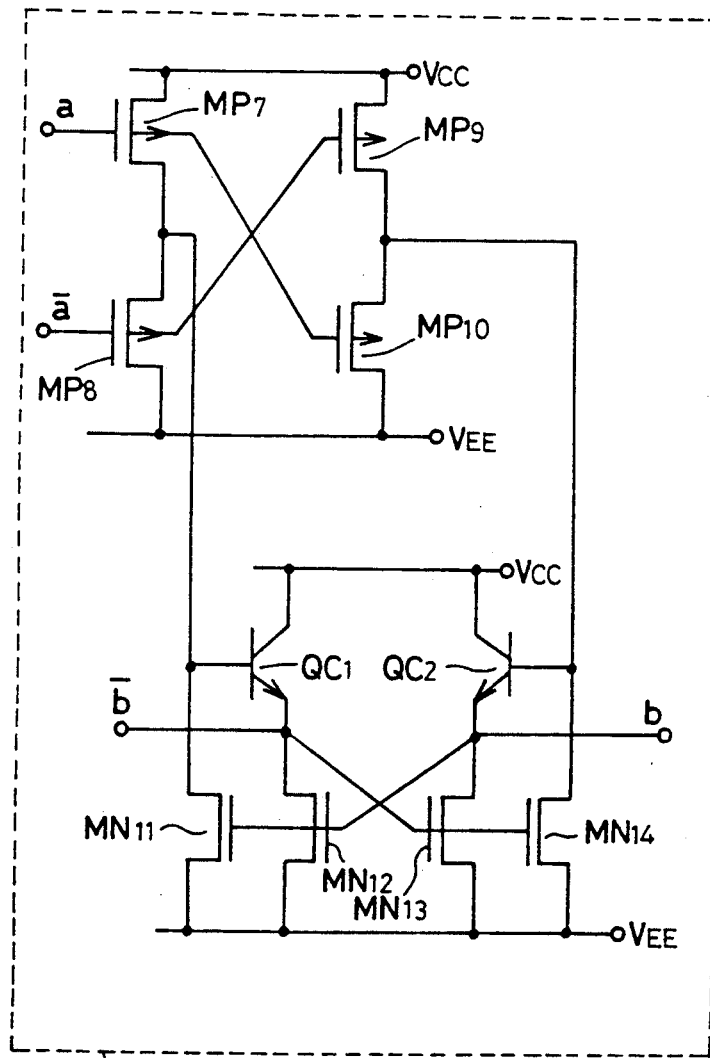
FIG. 22 is a circuit diagram showing another example of a level converting circuit.
Figure 23:
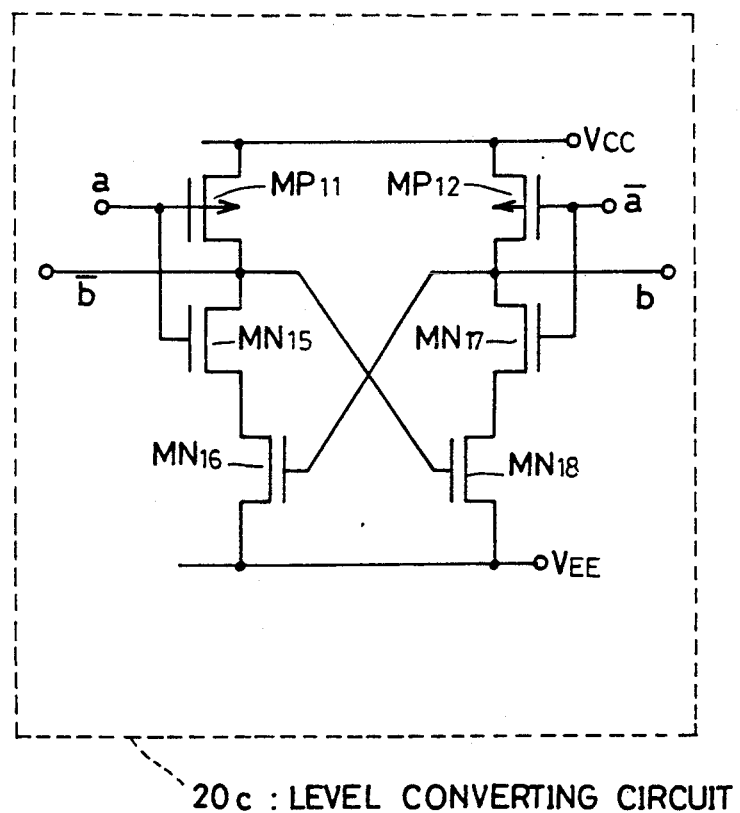
FIG. 23 is a circuit diagram showing still another example of a level converting circuit.

Such an effect can also be found in the case in which the level converting circuit shown in FIG. 22 or FIG. 23 is connected to the ECL buffer circuit of the above described embodiment.

In the ECL buffer circuit of the above described embodiment, the switching speed is high and the load drive capability is large. In addition, the output potential becomes constant when a certain period of time has passed. Furthermore, even if a transistor becomes further miniaturized, and the threshold voltage of the MOS transistor is decreased by scaling, it is possible to normally operate a level converting circuit utilizing a MOS transistor of a small threshold voltage, using an ECL buffer circuit in accordance with the present invention.

The H level of the output signals a, $\bar{a}$ is sufficiently higher than the threshold voltage of the PMOS transistor, so that the range of the operational voltage may be enlarged, and an operation at a low voltage is made possible.

The ECL buffer circuit in accordance with the above described embodiment may be applied to, for example, each portion of a BiCMOS·RAM. A BiCMOS·RAM, which has been developed to obtain a large capacity memory capable of a high-speed operation and having less power consumption, comprises a combination of a bipolar element and a CMOS circuit. The configuration of an ordinary RAM (Random Access Memory) is shown in FIG. 16.

Figure 16:
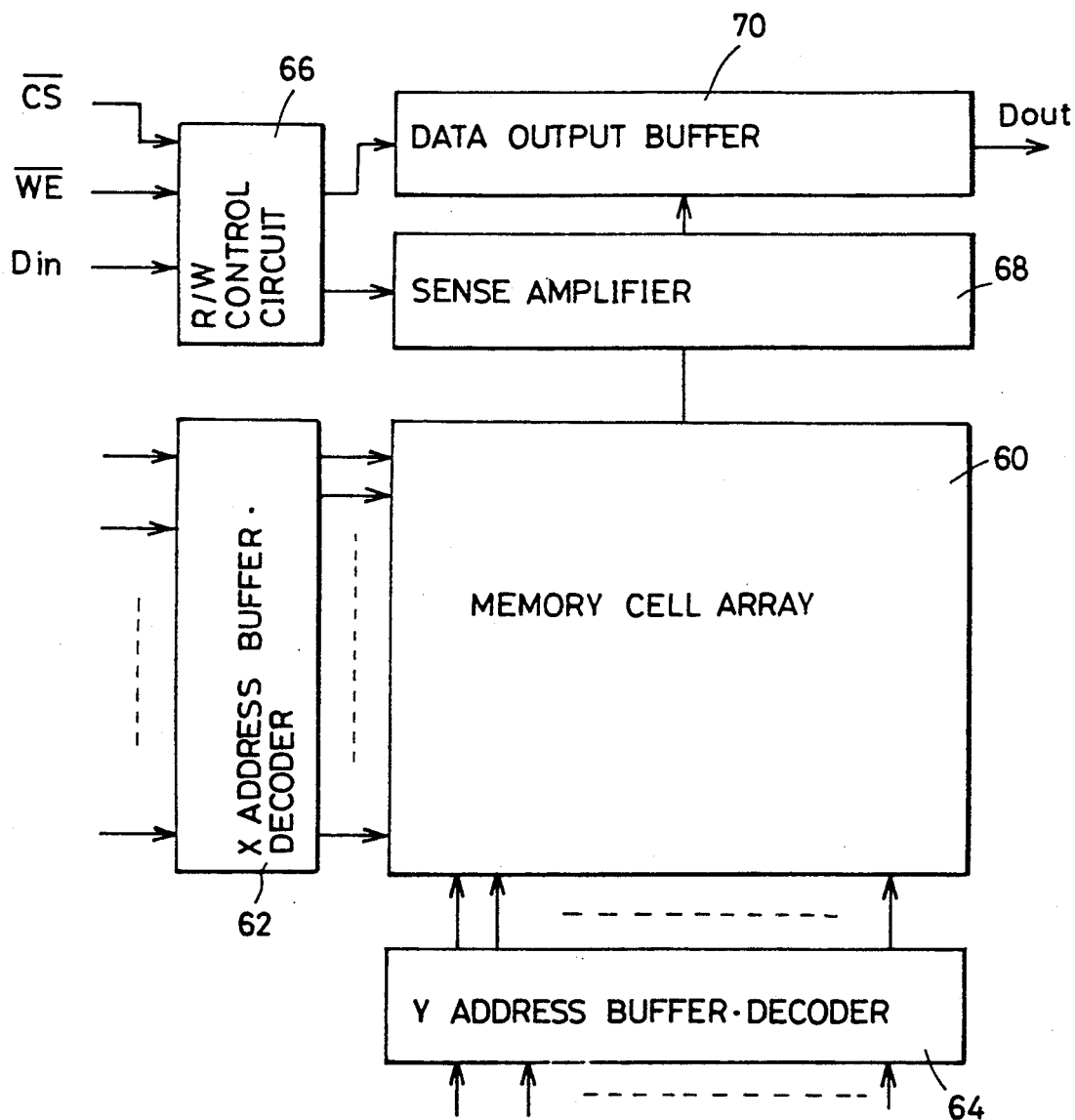
FIG. 16 is a block diagram showing an ordinary RAM configuration.
Figure 17A:
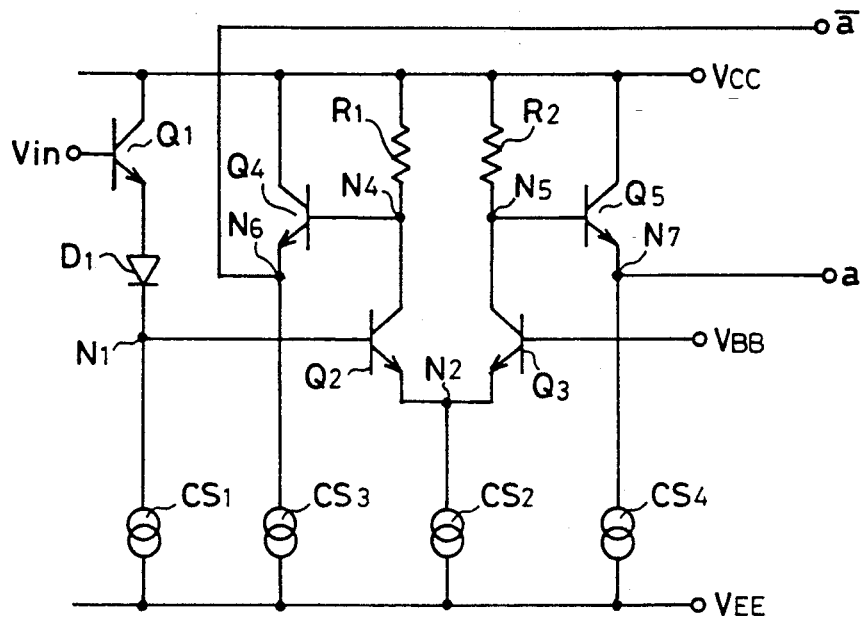
FIG. 17A is a circuit diagram of a first conventional ECL buffer circuit.
Figure 17B:
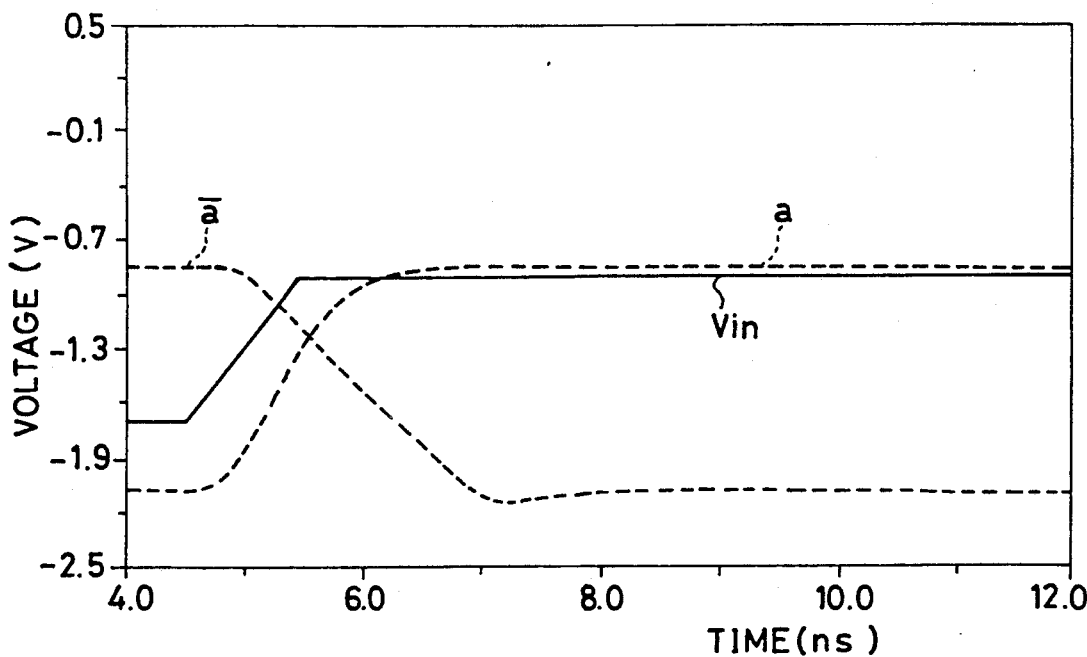
FIG. 17B is a waveform diagram of an input and an output signals of a first conventional ECL buffer circuit.

In FIG. 16, a plurality of word lines and a plurality of bit lines are arranged so as to cross each other, and memory cells are provided at the cross points of those word lines and bit lines. One word line of the memory cell array 60 is selected by X address buffer·decoder 62, one bit line of the memory cell array 60 is selected by a Y address buffer·decoder 64, and a memory cell provided at the cross points of these word line and bit line is selected. Data is written into the selected memory cell, or data stored in the memory cell is read out. A R/W control circuit 66 selects writing or reading of data. The R/W control circuit 66 operates in response to a write enable signal $\overline{WE}$ and a chip selecting signal $\overline{CS}$ which are externally supplied.

At the time of writing of the data, an input Din is supplied to the selected memory cell through the R/W control circuit 66. At the time of reading data, the data stored in the selected memory cell is detected and amplified by a sense amplifier 68, and taken out as an output Dout through a data output buffer 70.

In the BiCMOS·RAM, a memory cell array comprises a MOS transistor, and peripheral circuits such as an address buffer·decoder comprises a bipolar transistor or a combination of a bipolar transistor and an MOS transistor.

The ECL buffer circuit of the above described embodiment may be used, for example, in an address buffer contained in the X address buffer-decoder 62 and the Y address buffer-decoder 64. In this case, the input signal Vin supplied to the ECL buffer is an address signal. The ECL buffer circuit of the above described embodiment may also be used in a CS buffer, a WE buffer and Din buffer contained in the R/W control circuit 66. The CS buffer is a circuit for receiving a chip select signal $\overline{CS}$, the WE buffer is a circuit for receiving a write enable signal $\overline{WE}$, and the Din buffer is a circuit for receiving an input data Din.

In the description above, while an example is shown in which the ECL buffer circuit of the above described embodiment is applied to the level converting circuit for converting the level of the ECL input of BiCMOS-·ECL·LSI (or ECL·SRAM) into a BiCMOS or CMOS level, this ECL buffer circuit may be provided, for example, in the later stage of the ECL logic circuit formed within an LSI. The ECL buffer circuit, when applied to an ECL interface circuit from an ECL level to a BiCMOS or CMOS level, can achieve the same effect, and is also effective for all ECL circuits in view of the improvement of the ECL circuit characteristics.

As described above, the present invention may be applied not only to BiCMOS·RAM but also to other various circuits.

In addition, the present invention can be applied not only to a level converting circuit for coupling an ECL circuit and a MOS circuit, but also to a level converting circuit for coupling other kinds of logic circuits.

While $V_{CC}$ is the ground voltage, and $V_{EE}$ is the negative voltage in the above described embodiment, the present invention may be applied to a buffer circuit with the pluralities of the power supply voltage and the transistor being inverted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit connected to a voltage source for providing a predetermined voltage ($V_{CC}$), comprising
   a plurality of buffer circuit means, a first constant current source and a second constant current source,
   each of said plurality of buffer circuit means comprising
   an input node for receiving an input signal,
   an output node from which an output signal is derived,
   a first transistor, coupled between said voltage source and said output node, having a control terminal,
   a first resistance means connected between said voltage source and said control terminal of said first transistor,
   a second resistance means connected between said output node and said control terminal of said first transistor,
   a second transistor connected between said control terminal of said first transistor and said first constant current source, having a control terminal connected to said input node, and
   a third transistor connected between said output node and said second constant current source, having a control terminal receiving a signal in phase with said input signal.

2. A semiconductor integrated circuit according to claim 1, wherein said first resistance means, comprises:
   a third resistance means each provided in said plurality of buffer circuits and;
   a fourth resistance means provided in response to said each buffer circuit means.

3. A semiconductor integrated circuit according to claim 1, wherein each of said first, second and third transistors comprises bipolar transistors.

4. A semiconductor integrated circuit according to claim 1, wherein said input signal is a signal at an ECL level.

5. A semiconductor integrated circuit according to claim 1, further comprising an input circuit means including a third constant current source for providing a constant current to an input bipolar transistor receiving a predetermined signal and said bipolar transistor,
   an output signal of said input circuit means being provided to any one input node of said plurality of buffer circuit means.

6. A semiconductor integrated circuit according to claim 5, wherein said input circuit means further includes a voltage drop means connected between said bipolar transistor and said input node.

7. A semiconductor integrated circuit according to claim 6, wherein a control terminal of any one of said second transistor of said plurality of buffer circuit means is connected to the node between said bipolar transistor and said voltage drop means.

8. A semiconductor integrated circuit according to claim 1, wherein each of said first and said second resistance means includes a resistor.

9. A semiconductor integrated circuit according to claim 1, wherein each of said first and said second resistance means includes a field-effect transistor having a control terminal coupled to a predetermined potential.

10. A semiconductor integrated circuit according to claim 6, wherein said first constant current source includes:
    a transistor having a control terminal receiving a reference voltage; and
    a resistance means coupled between said transistor and a predetermined potential, and
    said second constant current source includes;
    a resistance means receiving a reference potential;
    a diode means connected between said resistance means and a predetermined potential; and
    a transistor coupled to said predetermined potential, having a control terminal connected to said resistance means.

11. A semiconductor integrated circuit connected to a voltage source providing a predetermined voltage ($V_{CC}$), comprising
    a first and a second buffer circuit means, a first constant current source and a second constant current source,
    each of said first and said second buffer circuit means including:
    an input node receiving an input signal;
    an output node from which an output signal is derived;
    a first transistor coupled between said voltage source and said output node, having a control terminal;
    a first resistance means comprising at least two resistive elements connected in series between said voltage source and said control terminal of said first transistor;

a second resistance means connected between said output node and a predetermined split point of said at least two resistive elements of a first resistance means of other buffer circuit means;

a second transistor connected between said control terminal of said first transistor and said first constant current source, having a control terminal connected to said input node; and a third transistor connected between said output node and said second constant current source, having a control terminal receiving a signal in phase with said input signal.

12. A semiconductor integrated circuit connected to a voltage source for providing a predetermined voltage ($V_{CC}$), comprising a plurality of buffer circuit means, a first constant current source (CS2) and a second constant current source (CS3), each of said plurality of buffer circuit means including:

an input node (N1) for receiving an input signal;

an output node (N6, N7) from which an output signal is derived;

a first transistor (Q4, Q5) coupled between said voltage source and said output node, having a control terminal;

a first resistance means (R1, R2) connected between said voltage source and said control terminal of said first transistor;

a field-effect element (Q11, Q12) connected between said output node and said control terminal of said first transistor, having a control terminal connected to the output node of other buffer circuit means;

a second transistor (Q2, Q3) connected between said control terminal of said first transistor and said first constant current source, having a control terminal connected to said input node; and a third transistor (Q6, Q7) connected between said output node and said second constant current source, having a control terminal for receiving a signal in phase with said input signal.

13. A semiconductor integrated circuit according to claim 12, wherein said first resistance means, comprises:

a third resistance means each provided in said plurality of buffer circuits and;

a fourth resistance means provided in response to said each buffer circuit means.

14. A semiconductor integrated circuit connected to a voltage source for providing a predetermined voltage ($V_{CC}$), comprising a first and a second buffer circuit means, a first constant current source and a second constant current source, each of said first and said second buffer circuit means including:

an input node for receiving an input signal;

an output node from which an output signal is derived;

a first transistor coupled between said voltage source and said output node, having a control terminal;

a first resistance means comprising at least two resistive elements connected in series between said voltage source and said control terminal of said first transistor;

a field-effect element connected between said output node and a predetermined split point of said at least two resistive elements of a first resistance means of other buffer circuit means, having a control terminal connected to the output node of said other buffer circuit means;

a second transistor connected between said control terminal of said first transistor and said first constant current source, having a control terminal connected to said input node; and a third transistor connected between said output node and said second constant current source, having a control terminal for receiving a signal in phase with said input signal.

15. A semiconductor integrated circuit connected to a voltage source for providing a predetermined voltage ($V_{CC}$), comprising a first and a second buffer circuit means, a first constant current source and a second constant current source, each of said first and said second buffer circuit means including:

an input node for receiving an input signal;

an output node from which an output signal is derived;

a first transistor coupled between said voltage source and said output node, having a control terminal;

a first resistance means connected between said voltage source and said control terminal of said first transistor;

a second transistor connected between said control terminal of said first transistor and said first constant current source, having a control terminal connected to said input node; and a third transistor connected between said output node and said second constant current source, having a control terminal for receiving a signal in phase with said input signal, said semiconductor integrated circuit further comprising a second resistance means connected between said output node of said first buffer circuit means and said output node of said second buffer circuit means.

16. A semiconductor integrated circuit connected to a voltage source for providing a predetermined voltage ($V_{CC}$), comprising a plurality of buffer circuit means, a first constant current source and a second constant current source, each of said plurality of buffer circuit means including:

an input node for receiving an input signal;

an output node from which an output signal derived;

a first transistor coupled between said voltage source and said output node, having a control terminal;

a first resistance means connected between said voltage source and said control terminal of said first transistor;

a field-effect element coupled between said output node and a predetermined voltage, having a control terminal connected to the output node of other buffer circuit means;

a second transistor connected between said control terminal of said first transistor and said first constant current source, having a control terminal connected to said input node; and a third transistor connected between said output node and said second constant current source, having a control terminal for receiving a signal in phase with said input signal.

17. A semiconductor integrated circuit according to claim 16, wherein
said predetermined voltage to which said field-effect element is coupled is equal to the voltage of said voltage source ($V_{CC}$).

18. A semiconductor integrated circuit according to claim 16, wherein
said predetermined voltage to which said field-effect element is coupled is a voltage ($V_{CL}$) at a level lower than that of the voltage of said voltage source.

* * * * *